(12) United States Patent
Callegari et al.

(10) Patent No.: US 7,015,152 B2
(45) Date of Patent: Mar. 21, 2006

(54) METHOD OF FILM DEPOSITION, AND FABRICATION OF STRUCTURES

(75) Inventors: Alessandro C. Callegari, Yorktown Heights, NY (US); Deborah Ann Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 10/674,961

(22) Filed: Sep. 30, 2003

(65) Prior Publication Data

US 2004/0071879 A1 Apr. 15, 2004

Related U.S. Application Data

(62) Division of application No. 09/676,882, filed on Sep. 29, 2000, now Pat. No. 6,664,186.

(51) Int. Cl.
*H01L 21/30* (2006.01)

(52) U.S. Cl. .................. 438/785; 438/381; 438/688; 257/300; 257/532; 423/600

(58) Field of Classification Search ........... 438/781, 438/785, 680, 681, 688; 423/579, 600; 257/300, 257/532

See application file for complete search history.

(56) References Cited

U.S. PATENT DOCUMENTS

| | | |
|---|---|---|
| 4,097,314 A | 6/1978 | Schlesier et al. |
| 5,431,734 A | 7/1995 | Chapple-Sokol et al. |
| 5,540,777 A | 7/1996 | Barbee et al. |
| 5,648,113 A | 7/1997 | Barbee et al. |
| 5,728,222 A | 3/1998 | Barbee et al. |
| 6,037,003 A | 3/2000 | Gordon et al. |
| 6,312,565 B1 | 11/2001 | Misra et al. |

OTHER PUBLICATIONS

Yom et al, Growth of gamma alumina thin films on silicon by MOCVD, Thin Solid Films 1992, pp. 72-75.*

Eble, R., et al., "Low Temperature Aluminum Oxide Deposition Using Trimethylaluminum", *Journal of Electronic Materials*, vol. 12, No. 3, pp. 587-601 (1983).

Kim, J.S., et al., "Fabrication of Aluminum Oxide Thin Films by a Low-Pressure Metalorganic Chemical Vapor Deposition Technique", *App. Phys. Lett.*, 62(7), Feb. 15, 1993.

Fournier, J., et al., "Preparation and Characterization of Thin Films of Alumina by Metal-Organic Chemical Vapor Deposition", *Mat. Res. Bull.*, vol. 23, pp. 31-36, 1988.

Klein, T.M., et al. "Evidence of Aluminum Silicate Formation During Chemical Vapor Deposition of Amorphous A12O3 Thin Films on Si (100)", *Applied Physics Letters*, vol. 75, No. 25, pp. 4001-4003, 1999.

Lo, S.-H, et al., "Quantum-Mechanical Modelling of Electron Tunneling Current From the Inversion Layer of Ultra-Thin-Oxide nMOSFET's", *IEEE Electron Device Letters*, vol. 18, No. 5, pp. 209-211, May 1997.

(Continued)

*Primary Examiner*—Alexander Ghyka
(74) *Attorney, Agent, or Firm*—Scully, Scott, Murphy & Presser; Robert M. Trepp

(57) ABSTRACT

A method of fabricating aluminum oxide films utilizing aluminum alkoxide precursors is described. The aluminum oxide film is formed by (a) providing an aluminum alkoxide precursor that is dissolved, emulsified or suspended in a liquid; (b) providing a vapor generated from the aluminum alkoxide precursor; and (c) depositing an aluminum oxide film on the substrate at a temperature greater than 500° C.

26 Claims, 12 Drawing Sheets

OTHER PUBLICATIONS

Mutoh, H., et al., "Multilayer Metallization with Planar Interconnect Structure Utilizing CVD Al2O3 Film", *J. Electrochem. Soc.: Solid-Science and Technology*, vol. 12, No. 7, pp. 987-992, Jul. 1975.

Yom, S.S., et al., "Growth of ?-Al2O3 Thin Films on Silicon by Low Pressure Metal-Organic Chemical Vapour Deposition", *Elsevier Sequoia*, 213, pp. 72-75, 1992.

* cited by examiner

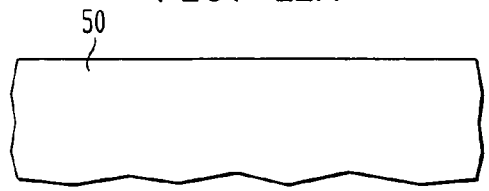
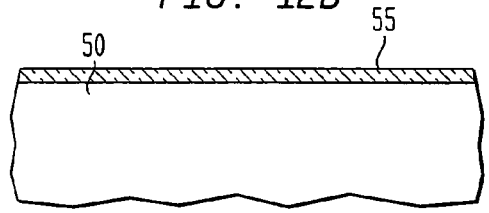
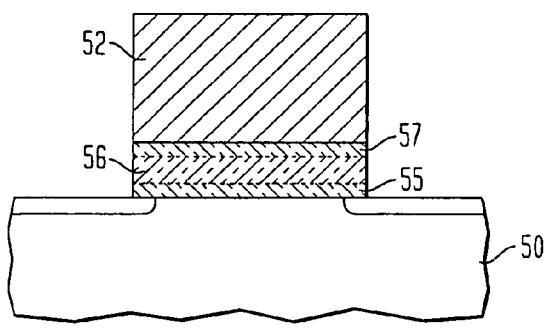
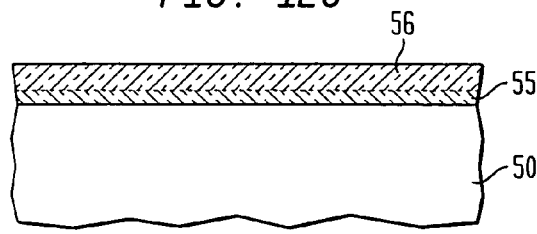
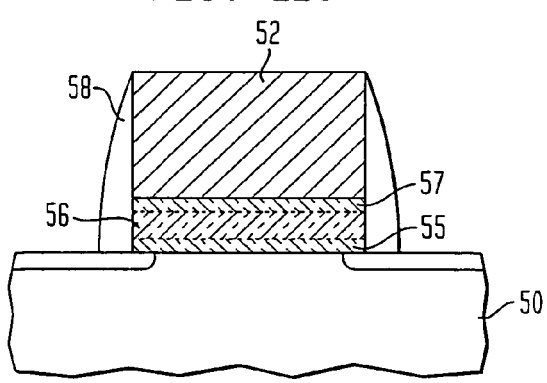
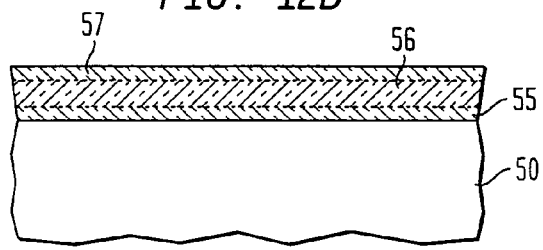
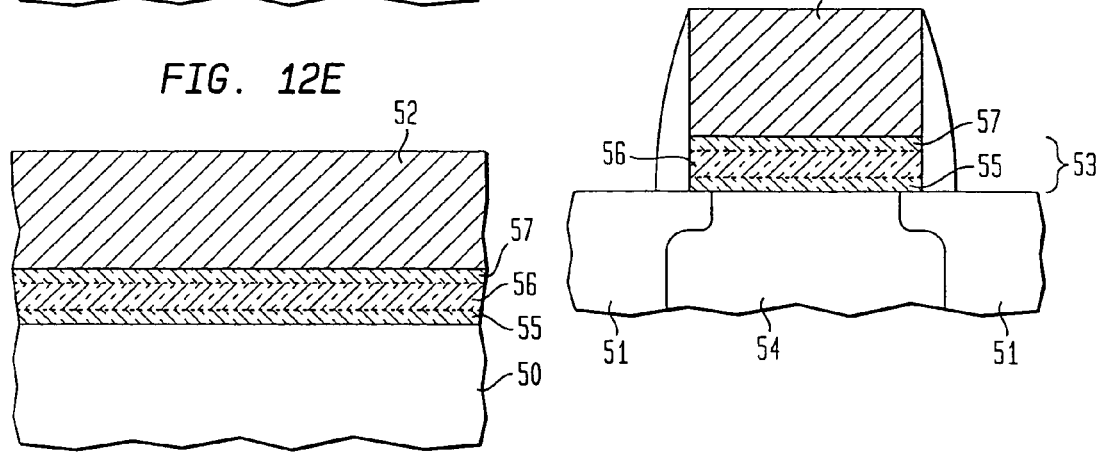

METHOD OF FILM DEPOSITION, AND FABRICATION OF STRUCTURES

RELATED APPLICATIONS

This application is a divisional of U.S. application Ser. No. 09/676,882, filed Sep. 29, 2000 now U.S. Pat. No. 6,664,186.

FIELD OF THE INVENTION

The present invention relates to a method of fabricating electronic devices that contain at least a layer of aluminum oxide deposited by chemical vapor deposition (CVD) or atomic layer deposition (ALD) utilizing aluminum alkoxide precursors and deposition temperatures greater than 500° C.

BACKGROUND OF THE INVENTION

In the quest for improved performance, electronic circuits are becoming denser and devices smaller. For example, the most common gate dielectric in metal oxide semiconductor field effect transistors (MOSFET) has been $SiO_2$. However, as the thickness of $SiO_2$ approaches 20 Å, substantial problems appear, including large leakage currents through the gate dielectric, long term dielectric reliability, and difficulty of manufacture and thickness control. One solution to the above problems is to use thick films of materials such as aluminum oxide which have a dielectric constant larger than $SiO_2$. Thus, the physical thickness of the gate dielectric can be large while the electrical equivalent thickness relative to $SiO_2$ films can be scaled. The electrical equivalent thickness, $t_{eq}$, of a high dielectric constant material, relative to $SiO_2$, for example, may be calculated using the formula:

$$t_{eq}=t_{phy}(\in_{SiO2}/\in_{high\ K})$$

where $t_{phy}$ is the actual thickness of the substitute metal oxide gate dielectric, such as aluminum oxide and $\in_{SiO2}$ and $\in_{high\ K}$ are the dielectric constants of $SiO_2$ and the metal oxide gate dielectric film, respectively.

Similar problems are encountered in scaling capacitors in memory devices. As the circuits become denser and the devices smaller, a material with a higher capacitance such as aluminum oxide is necessary to store adequate charge in the capacitor. Aluminum oxide has a dielectric constant of 10, which is more than double the dielectric constant of $SiO_2$ ($\in=4$) and is thus an attractive material for replacement of $SiO_2$ in transistors and capacitors.

However, CVD of aluminum oxide from alkyl aluminum CVD precursors, such as trimethylaluminum seems to be inherently contaminated with carbon; see R. S. Ehle, et al. J. Electron. Mater. Vol. 12, 1983, p. 587. Similar carbon contamination is observed in aluminum oxide deposited from alkylaluminum alkoxides. XPS survey spectrum and Auger depth profile of aluminum oxide deposited at 400° C. on Si with an alkylaluminum alkoxide (triethyldialuminum tri-sec-butoxide) show carbon contamination throughout the film. See, for example, T. M. Klein, et al., Appl. Phys. Lett., Vol. 75 1999, p. 4001. Similar carbon contamination would be expected in films grown with similar alkylaluminum alkoxides as described, for example, in U.S. Pat. No. 6,037,033. Aluminum oxide has been deposited using aluminum β-diketonates, such as aluminum tris(2,4-pentanedionato) and aluminum tris(tetramethylheptanedionato). However β-diketonates are known to undergo complex decomposition pathways which may lead to carbon incorporation in the film. Low deposition temperatures and addition of $H_2O$ as an oxidant are recommended to obtain aluminum oxide films; See, J. S. Kim, et al., Appl. Phys Lett., 62(7) 1993 P. 681. However, low deposition temperatures and water results in a porous film with excess OH. Deposition of aluminum oxide from $AlCl_3$ and $H_2$ and $CO_2$ has been described in U.S. Pat. No. 4,097,314. An incubation period of about 30 seconds is necessary before film growth occurs which results in an uncertainty in controlling growth rates of thin films (less than 1000 Å). Residual Cl and H contaminates are present in the film. Additionally $AlCl_3$ is highly corrosive generating HCl as a byproduct.

Deposition of aluminum oxide from aluminum alkoxides is known and deposition of aluminum oxide at temperatures less than 500° C. has been described; See, for example, J. A. Aboaf, J. Electrochem. Soc. 1967, Vol. 114(9), p. 948; J. Fournier, Mat. Res. Bull., 23 31 (1988); and H. Mutoh, J. Electrochem. Soc. 122, 987 (1975). Deposition of aluminum oxide with aluminum isopropoxide deposited on Si at 740° C. has been reported by S. S. Yom et al., Thin Solid Films, 213, 72, 1992. However, as described in U.S. Pat. Nos. 5,431,734, 5,540,777, 5,648,113, and 5,728,222, aluminum alkoxides are known to isomerize during heating and delivery resulting in unreproducible precursor delivery and film growth. Moreover the aforementioned U.S. patents describe methods and apparatuses for depositing aluminum oxide from aluminum isopropoxide utilizing FTIR monitoring of the aluminum isopropoxide vapor from a bubbler to improve reproducibility. Despite the improved reproducibility, the '734, '777, '113 and '222 patents suffer from the disadvantage of using conventional bubbler technology.

The other previous work with aluminum alkoxides patents also have utilized conventional bubbler technology which involves a carrier gas bubbled through a neat (i.e., without solvent) precursor at an elevated temperature. The conventional bubbler technology relies on a consistent vapor pressure of the precursor to deliver a uniform precursor flux to the film. In addition, because vapor pressure is directly related to temperature, conventional bubbler technology suffers from the disadvantages of needing to maintain a bubbler temperature with minimal variation during a run and from run to run. Fluctuations in precursor flux are known to result in variable film growth rates. Solid compounds are known to sinter and change surface area over time, resulting in nonuniformity in film growth rates from run to run. Sintering is not a problem for liquid precursors, but over time the liquid precursors may degrade from the thermal cycling and thermal load placed on the precursor. Additionally, at elevated temperatures, decomposition processes are accelerated. As described in U.S. Pat. Nos. 5,431,734, 5,540,777, 5,648,113, and 5,728,222, elevated temperatures and thermal cycling of aluminum alkoxide during vaporization in a conventional bubbler contributes to premature degradation of the aluminum alkoxide over time. Aluminum alkoxides change their chemical state by ligand rearrangement, cluster formation, or oxidation. Aluminum alkoxides are known to react with water or oxygen inadvertently introduced into the bubbler through inadequately purified carrier gases bubbled through the precursor, air leaks, or water and oxygen adsorbed on the bubbler walls. Furthermore, aluminum alkoxides are known to isomerize during heating resulting in many different species with varying vapor pressures, with the result that consistent vapor pressure is difficult to achieve with conventional bubbler technology.

An additional difficulty of depositing aluminum oxide by CVD is that aluminum oxide exists in a number of morphological forms. The aluminum oxide polymorph obtained is critically dependent on deposition conditions, such as the CVD precursor, oxidant, growth temperature and pressure, and substrate. Additionally, the only thermally stable modification of aluminum oxide is α-alumina (α-$Al_2O_3$, corundum or sapphire). All other polymorphs are metastable and irreversibly converted to α-$Al_2O_3$ at sufficiently high temperatures.

An additional difficulty of fabricating devices on silicon with aluminum oxide deposited on Si by CVD is the potential growth of an interfacial oxide layer during deposition or during post deposition processing. See for example, T. M. Klein, et al., Appl Phys. Lett., Vol 75 1999, p. 4001.

In view of the drawbacks with prior art processes of forming aluminum oxide films, there is a continued need for developing a new and improved method for depositing aluminum oxides which avoids each of the above mentioned prior art problems.

SUMMARY OF THE INVENTION

The present invention relates to a method of depositing aluminum oxide films by chemical vapor deposition (CVD) or atomic layer deposition (ALD). The present invention is also directed to a method of fabricating electronic devices that contain aluminum oxide deposited by the inventive method. Suitable electronic devices that can be fabricated in the present invention include, but are not limited to: transistors, capacitors, diodes, resistors, switches, light emitting diodes, lasers, wiring structures, interconnect structures or any other structure wherein the aluminum oxide film of the present invention can be incorporated therein.

In a broad aspect, the present invention relates to chemical vapor deposition or atomic layer deposition of aluminum oxide utilizing an aluminum alkoxide precursor dissolved, emulsified or suspended in a liquid; vaporizing the aluminum alkoxide precursor; and depositing a constituent of the vaporized precursor on a substrate to form a film at a deposition temperature of greater than 500° C. In this aspect, the liquid may or may not be co-vaporized with the precursor. In one embodiment, the inert liquid is vaporized with the precursor. In an alternative embodiment, the inert liquid is not vaporized and is diverted from the reactor in liquid form. In yet another embodiment of the present invention, the deposited film is annealed after conducting the inventive processing steps.

Preferred aluminum alkoxide precursors that may be employed in the present invention include, but are not limited to: aluminum iso-propoxide, aluminum sec-butoxide, aluminum ethoxide, aluminum iso-butoxide, aluminum methoxide, aluminum neo-pentoxide, aluminum propoxide, aluminum butoxide, aluminum tertiary-butoxide, or aluminum phenoxide.

Another aspect of the present invention relates broadly to the fabrication of multilayer structures incorporating aluminum oxide deposited by the inventive method.

Further aspects of the present invention include:

Fabricating an electronic structure incorporating a film deposited by the inventive method.

Fabricating a complementary metal oxide semiconductor (CMOS) integrated circuit (IC) logic device which contains both n-type field effect transistors (NFETs) and p-type field effect transistors (PFETs) formed on a single substrate incorporating a film deposited by the inventive method, as shown in FIG. 1.

Fabricating an integrated circuit capacitor incorporating a film deposited by the inventive method, as shown in FIG. 2.

Fabricating an integrated circuit wiring structure incorporating a film deposited by the inventive method, as shown in FIG. 3.

BRIEF DESCRIPTION OF THE DRAWINGS

FIGS. 12A–H are illustrations of a cross-sectional view of a transistor containing a multilayer dielectric through various processing steps.

DETAILED DESCRIPTION OF THE INVENTION

As stated above, the present invention broadly relates to CVD or ALD of aluminum oxide, and fabrication of an electronic devices incorporating a film deposited by the inventive method. More specifically, the present invention relates to CVD or ALD of aluminum oxide utilizing an aluminum alkoxide precursor dissolved, emulsified or suspended in a liquid, vaporizing the aluminum alkoxide precursor so as to form a vaporized precursor, and depositing a constituent of the vaporized precursor on a substrate to form a film at a deposition temperature of greater than 500° C. More particularly, the deposition is carried out at a temperature of from about 500° to about 1200° C. Following the deposition of the aluminum oxide film, the film may be annealed utilizing any conventional annealing process such as a forming gas anneal.

The precursor is defined in the present invention as any aluminum alkoxide. A generalized formula for the precursor of the present invention is $Al(OR)_3$ where R is a ligand selected from linear or branched $C_1$–$C_{12}$ alkyls The preferred precursors are aluminum iso-propoxide, aluminum sec-butoxide, aluminum ethoxide, aluminum iso-butoxide, aluminum methoxide, aluminum propoxide, aluminum butoxide, aluminum tertiary-butoxide, or aluminum phenoxide.

The liquid is selected from aliphatic hydrocarbons, aromatic hydrocarbons, alcohols, ethers, aldehydes, ketones, acids, phenols, esters, amines, alkylnitriles, halgonated hydrocarbons, silylated hydrocarbons, thioethers, amines, cyanates, isocyanates, thiocyanates, silicone oils, nitroalkyls, alkylnitrates and/or mixtures of one or more of the above. The precursor may be dissolved, emulsified or suspended in the liquid using techniques well known to those skilled in the art.

Vaporization is carried out by heating the precursor and liquid to a temperature of from about 40° to about 250° C. for a time period sufficient to convert the liquid precursor into a vaporized precursor. The vaporization may be carried out in the presence of an inert gas such as He, $N_2$ or Ar, which gas may also be used during the deposition of the aluminum oxide.

The method of aluminum oxide deposition of the present invention can be used in any CVD or ALD process with any delivery means using any number of co-reactants. Thus, the invention is not limited to a specific CVD or ALD apparatus or delivery system. Chemical vapor deposition (CVD) is defined as introduction of multiple reagents into a reactor simultaneously. Atomic layer deposition (ALD) is defined as sequential introduction of multiple reagents into a reactor, including, but not limited to: atomic layer epitaxy, digital chemical vapor deposition, pulsed chemical vapor deposition and other like methods.

Figure 1:
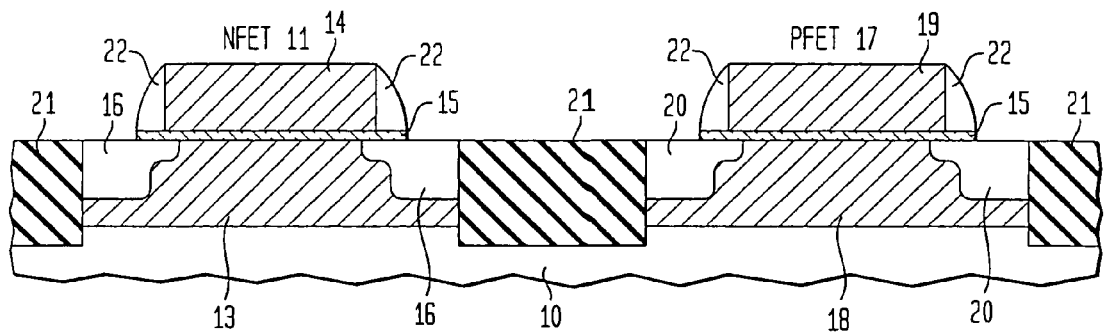
FIG. 1 is an illustration of a cross-sectional view of a integrated circuit with both PFET and NFET devices on a single substrate.

One aspect of the present invention relates broadly to fabrication of a structure of a complimentary metal oxide semiconductor (CMOS) integrated circuit logic device incorporating aluminum oxide deposited by the inventive method. More specifically, the present invention relates to the fabrication of a CMOS integrated circuit containing both n-type field effect transistors (NFETs) and p-type field effect transistors (PFETs) formed on a single substrate. As shown in FIG. 1, NFET device 11 is formed on a p-type conductivity region 13 of substrate 10 and contains a gate electrode 14 formed on a gate dielectric 15 and a pair of n-type source/drain regions 16 formed on laterally opposite sides of gate electrode 14 is noted that the ohmic contacts are not shown in FIG. 1.

Similarly, PFET device 17 is formed on a n-type conductivity region 18 of substrate 10 and contains the gate electrode 19 formed on gate dielectric 15 and a pair of p-type conductivity source/drain regions 20 formed along opposite sidewalls of gate electrode 19. The ohmic contacts are not shown. The NFET and PFET devices are separated by shallow trench isolation 21 and by spacers 22. In this aspect of the invention, gate dielectric 15 incorporates aluminum oxide deposited by the inventive method.

Figure 2:
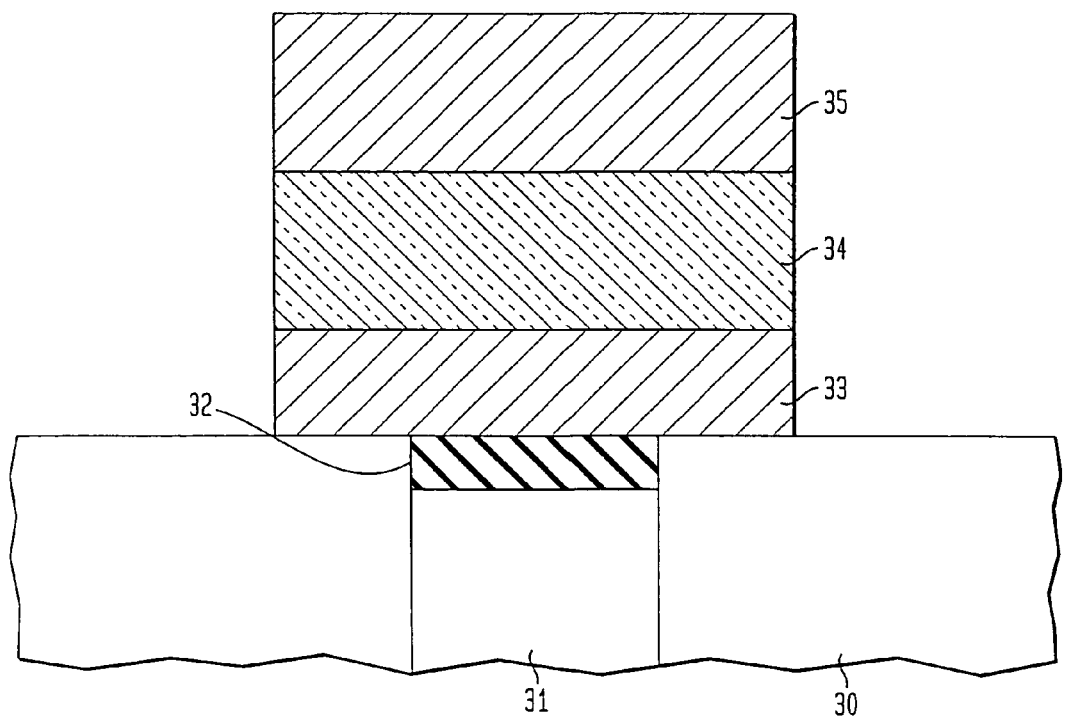
FIG. 2 is an illustration of a cross-sectional view of an integrated circuit capacitor.

Another aspect of the present invention relates broadly to fabrication of a structure of an integrated circuit capacitor incorporating aluminum oxide deposited by the inventive method. More specifically, the present invention relates to the fabrication of a capacitor. As shown in FIG. 2, a typical capacitor is formed on a substrate 30, connected by a plug 31 to a transistor, with a barrier 32 and consists of a bottom electrode 33, a dielectric material 34 which may or may not be ferroelectric, and a top electrode 35. In this aspect of the present invention, the dielectric material 34 incorporates aluminum oxide deposited by the inventive method. The capacitor may be stack or trench.

Figure 3A:
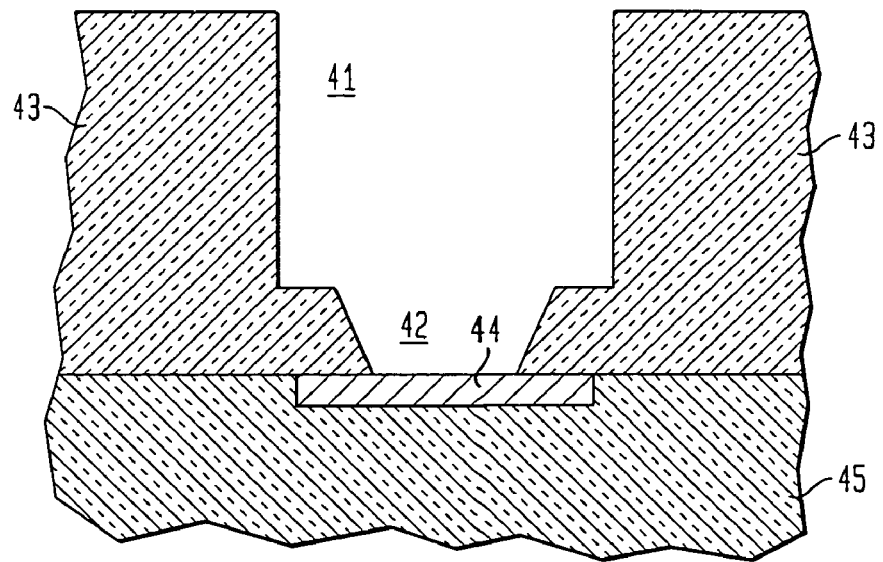
FIGS. 3A–B are illustrations of a cross-sectional view of an integrated circuit wiring structure.
Figure 3B:
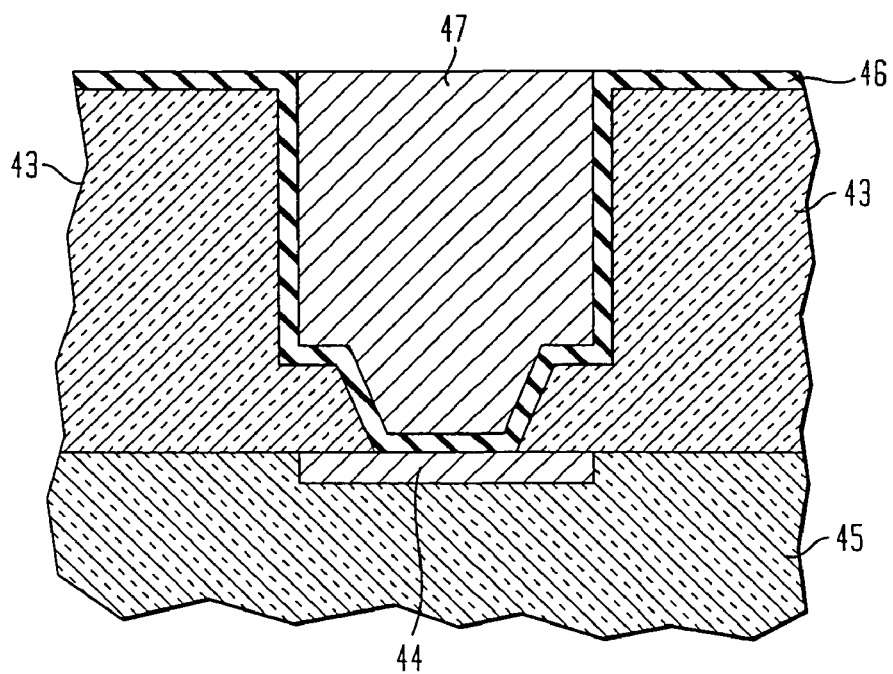

A yet further aspect of the present invention relates broadly to fabrication of a structure of an integrated circuit wiring structure incorporating aluminum oxide deposited by the inventive method. As shown in FIG. 3A, a typical wiring structure is formed by etching trenches 41 and vias 42 into a dielectric layer 43. Below dielectric layer 43 is a metal thin film wire 44 and a dielectric layer 45 of a wiring layer. In FIG. 3B, the trench and via are filled with a barrier material 46 and a wiring metal 47. In this aspect of the invention, the dielectric material 43 or 45 incorporates aluminum oxide deposited by the inventive method.

The above is a generic description of the present invention, the following description provides specific details of the present invention. It should be noted that in each of the above described electronic devices conventional techniques are used in conjunction with the presently described method.

EXAMPLE 1

Chemical Vapor Deposition of Aluminum Oxide

The aluminum oxide films were deposited in a quartz horizontal hot wall CVD reactor equipped with a 1×3×8" quartz flow cell. An ATMI (Advanced Technology and Materials, Inc. Danbury, Conn.) LDS 300B liquid delivery system and vaporizer was used to introduce precursors into the reactor. The aluminum alkoxide source mixture was comprised of 40 grams of aluminum iso-propoxide, Al(i-$OC_3H_7)_3$, and 1 liter of iso-propanol. A thin layer (less than 20 Å) of $SiO_xN_y$ was deposited on a silicon wafer prior to growth of aluminum oxide. The aluminum alkoxide source mixture was flowed at 0.2–0.05 ml/min, preferably 0.05 ml/min. The vaporizer temperature was 120–180° C., preferably 120° C. Anhydrous nitrogen was introduced into the vaporizer at 20–2000 sccm, preferably 200 sccm as a carrier gas for the volatilized aluminum iso-propoxide. A mixture of nitrogen and oxygen was introduced through a separate inlet as the reactant gas. The system pressure was 5 Torr during growth. The substrate was heated by an external high intensity infrared lamp and the susceptor was comprised of Hastalloy. The temperature of the susceptor was monitored by insertion of a thermocouple into the susceptor. Aluminum oxide was deposited at 350–700° C., preferably at temperatures of greater than 500° C.

Figure 4:
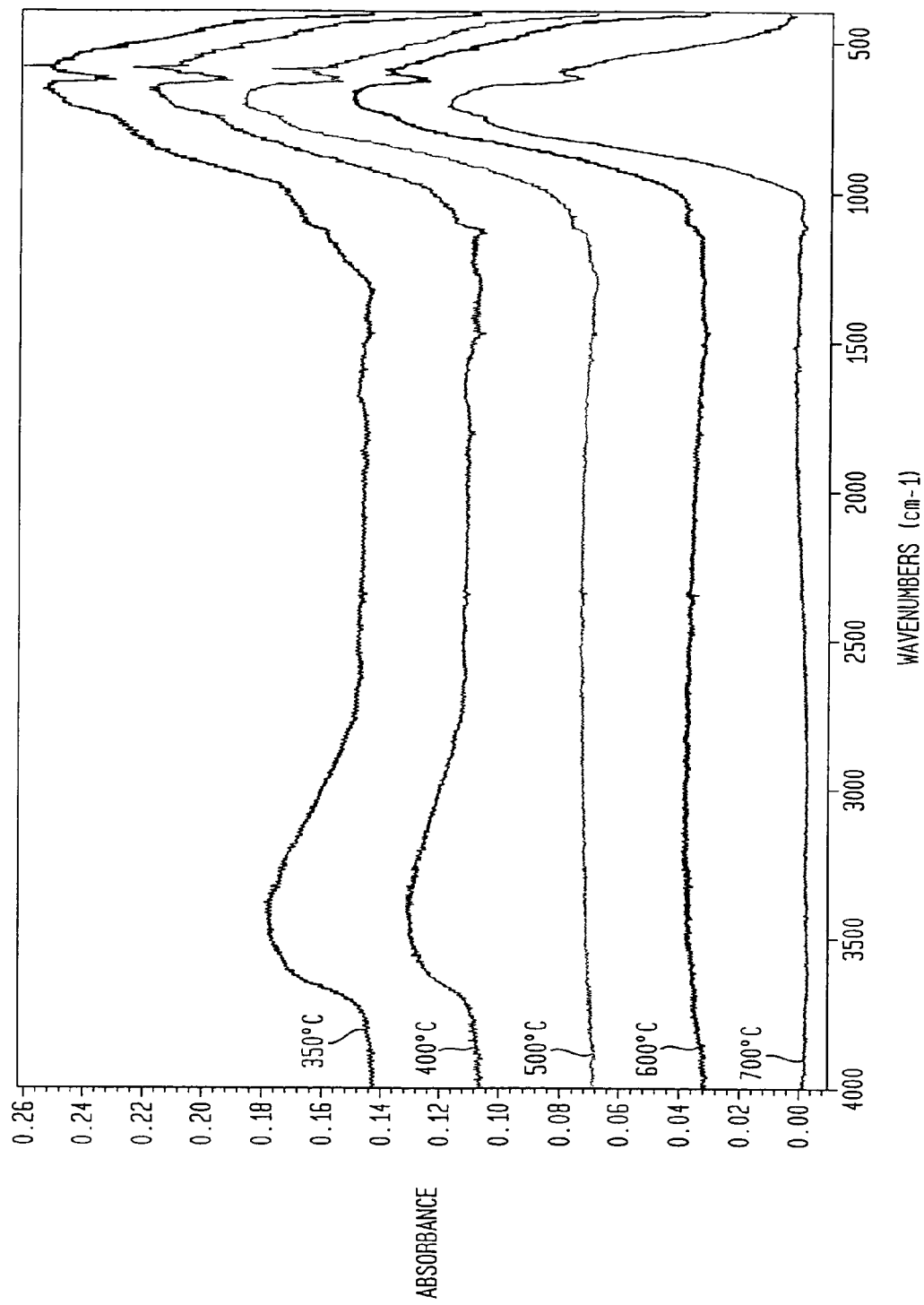
FIG. 4 is a FTIR spectrum of as deposited aluminum oxide films at various deposition temperatures.

As shown in the FTIR spectra of the as deposited films (see FIG. 4), the aluminum oxide films deposited at 350° C. and 400° C. contained a broad absorption band at 3700–3000 $cm^{-1}$ which is assigned to O—H stretching vibrations of OH and $H_2O$ in the as deposited aluminum oxide films. However, at deposition temperature of 500° C. and greater, no absorption band at 3700–3000 $cm^{-1}$ was observed. A distinctive narrow sharp strong absorption was observed at 581 $cm^{-1}$ in the spectra of aluminum oxide deposited at 350° C., 400° C., and 500° C. Aluminum oxide with similar absorption spectra have been defined as γ-$Al_2O_3$. At a deposition temperature of 600° C. and 700° C., the peak at 581 $cm^{-1}$ was not observed and the strong absorption band 1000 and 400 $cm^{-1}$ narrowed, signifying a different polymorph of aluminum oxide. No peaks assignable to $SiO_2$ were observed in the FTIR spectra of the as deposited films.

Figure 5:
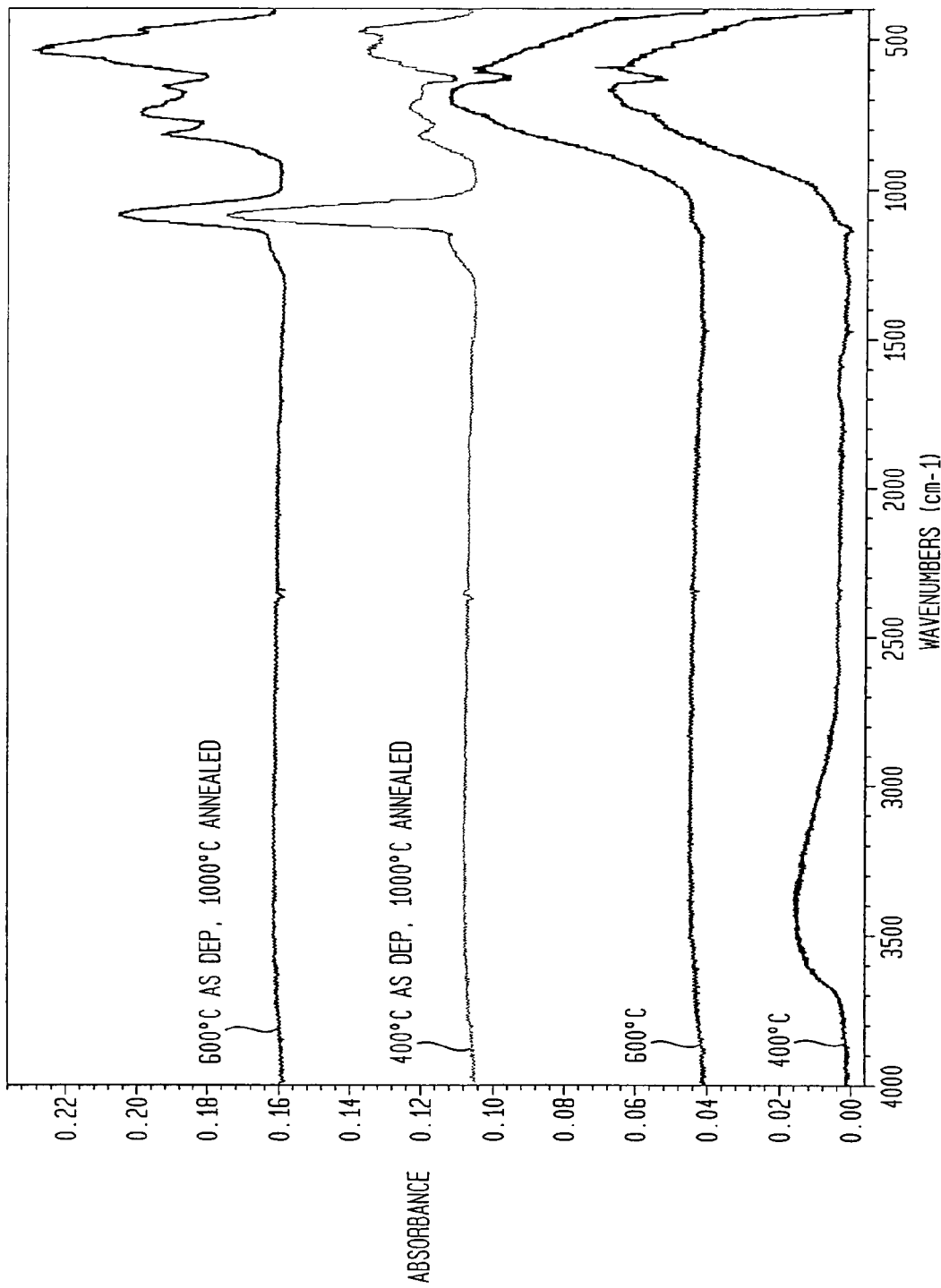
FIG. 5 is a FTIR spectrum of as deposited or as deposited/annealed aluminum oxide films.

The as deposited films were annealed at 1000° C. for 30 min in oxygen. As shown in the FTIR spectra of the annealed films. (FIG. 5), the aluminum oxide films deposited at 400° C. had strong absorptions assignable to $SiO_2$. The strong absorptions at 1200 and 1080 cm$^{-1}$ are ascribed to the LO and TO components of the asymmetric stretch of the SiO$_4$ unit, respectively. The absorption bands at 800 cm$^{-1}$ and 450 cm$^{-1}$ are attributed to skeletal network Si—O—Si symmetric stretching and bond bending, respectively. The remaining absorption bands are assigned to Al—O stretching and bending vibrations. However, in the spectra of the aluminum oxide film deposited at 600° C., the relative peak intensities and areas of the absorptions assigned to SiO$_2$ (1200, 1080, 800 and 450 cm$^{-1}$) was reduced relative to the absorptions assigned to Al—O. It is believed that the aluminum oxide deposited at temperatures less than 500° C. which contain significant quantities of OH and/or absorbed water as observed in the FTIR spectra are less dense, contain an excess of oxygen and more readily allow the diffusion of oxygen through the film facilitating the formation of an interfacial oxide layer during post deposition annealing.

Aluminum oxide films were analyzed for carbon content by nuclear reaction analysis (NRA). The samples were analyzed for total C and O using a 1.05 MeV beam of deuterons and the $^{16}$O(d,p1)$^{17}$O* and $^{12}$C(d,p0)$^{13}$C nuclear reactions. Each sample was run three times to check its stability during irradiation. Due to the low stopping power of the particles and the large positive Q-values, these reactions have poor depth sensitivity, and cannot be used to directly separate contributions from the surface or substrate. First, a linear background was subtracted from the $^{16}$O(d, p1)$^{17}$O* reaction peak in all spectra. A 1000 Å SiO$_2$ standard was used to normalize the oxygen data. Since the reaction yield is constant to within ±5% over this depth range, the average value was used to reduce the analysis to simple ratios of the reaction yields. A density of 2.3 was assumed, to give an areal density for this standard of 4.6E17 $^{16}$O/cm$^2$. Next, a linear background was subtracted from the 12C(d, p0)$^{13}$C reaction peak in all spectra. A 20 microgram/cm$^2$ carbon foil on a Si substrate was used to normalize the carbon data. The reaction yield is constant to within ±3% over this depth range, so as in the case of the oxygen analysis, an average value was used to simplify the analysis. The areal density used for this sample was 1.0E18 $^{12}$C/cm$^2$. Finally, these numbers for carbon are very close to the surface contamination levels one normally sees on an uncleaned sample. To get an estimate of this, three more runs were conducted under the same conditions on plain silicon wafers having nothing but native oxide. Under ion beam bombardment, the carbon reaction yield first decreases slightly, (due to desorption of volatile organics) and then increases slowly and steadily (due to cracking of residual hydrocarbons in the vacuum system at the point of beam incidence). Two runs on virgin spots gave results of 12.8±0.5 and 17.7±0.6 in the above units. A third run on a spot that had 20× the normal exposure to the beam gave a result of 40±1. From this, the surface carbon added during the run was no more than 2E14 $^{12}$C/cm$^2$, and that an average surface contribution of 15E14 $^{12}$C/cm$^2$ could be subtracted from the above carbon results.

As summarized in Table 1, minimal carbon was observed by nuclear reaction analysis. As deposited aluminum oxide films grown at 600° C. contained 0.06 atomic percent of carbon, whereas films grown at 400° C. or less contained about 1% atomic percent of carbon. Annealing the as depos ited films in oxygen at 600° C. for 30 minutes did not affect the carbon levels in the film within experimental variation.

TABLE 1

Carbon content of aluminum oxide films as determined by nuclear reaction analysis.

| $T_{deposition}$ ° C. | thickness nm | As Reacted atomic % C | Annealed atomic % C |
|---|---|---|---|
| 350 | 1,626 | 1.4 | 1.5 |
| 0 | 732 | 1 | 0.8 |
| 375 | 343 | 1 | 0.9 |
| 400 | 979 | 1.2 | 1.4 |
| 400 | 400 | 1 | 1.1 |
| 500 | 1,019 | 0.2 | 0.2 |
| 600 | 1,280 | 0.06 | 0.03 |

Figure 6:
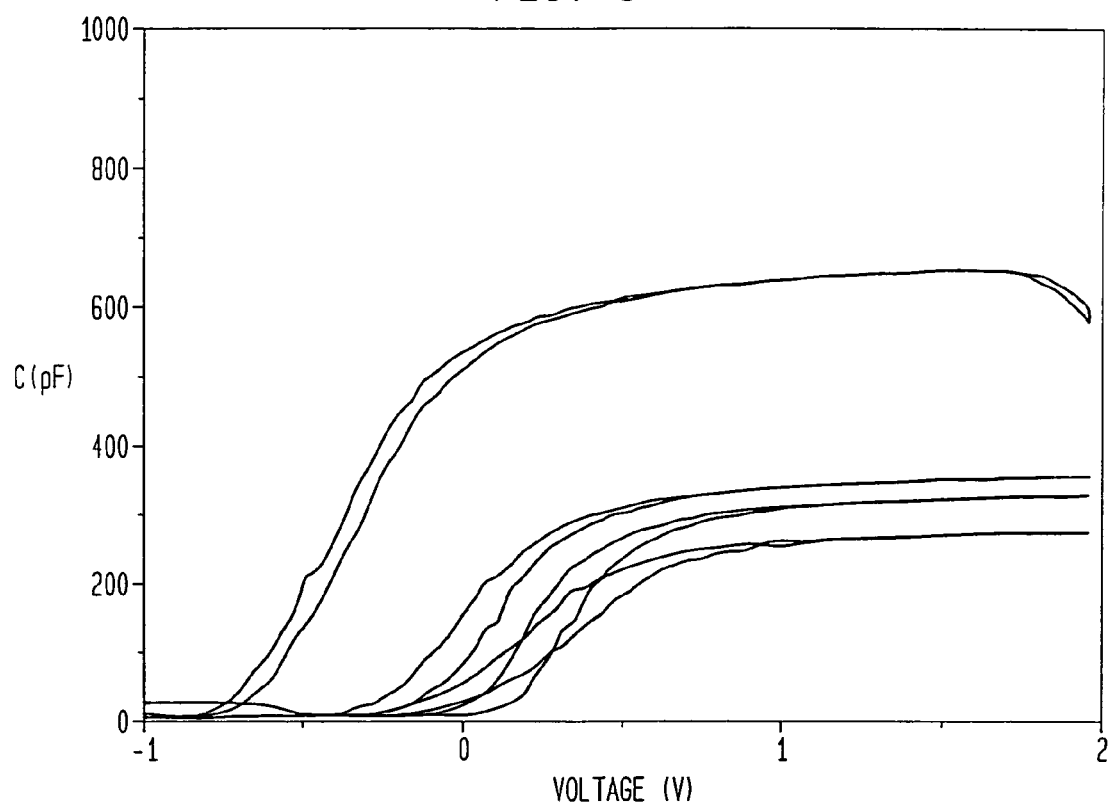
FIG. 6 is plot of capacitance, C, (pF) vs. voltage (V) showing high frequency (100 KHz) CV curves of Al oxide films with different thickness deposited at 500° C.
Figure 7:
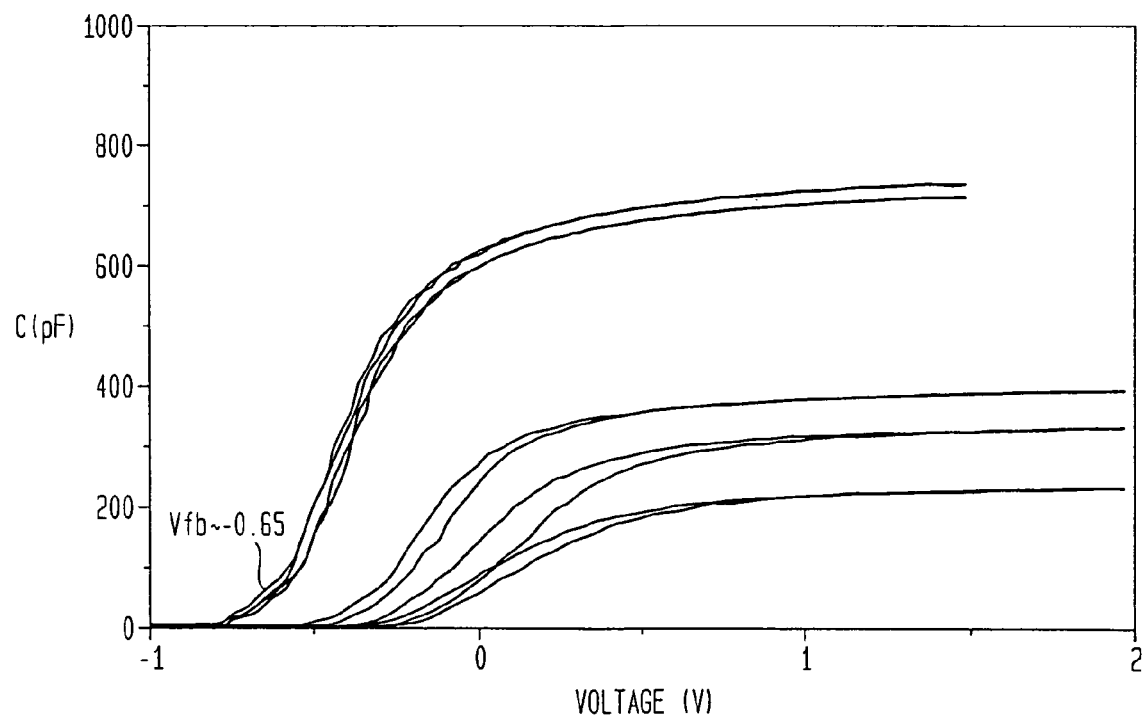
FIG. 7 is a plot of capacitance, C, (pF) vs. Voltage, V, for Al oxide films deposited at 600° C. and annealed in $O_2$ and forming gas.
Figure 8:
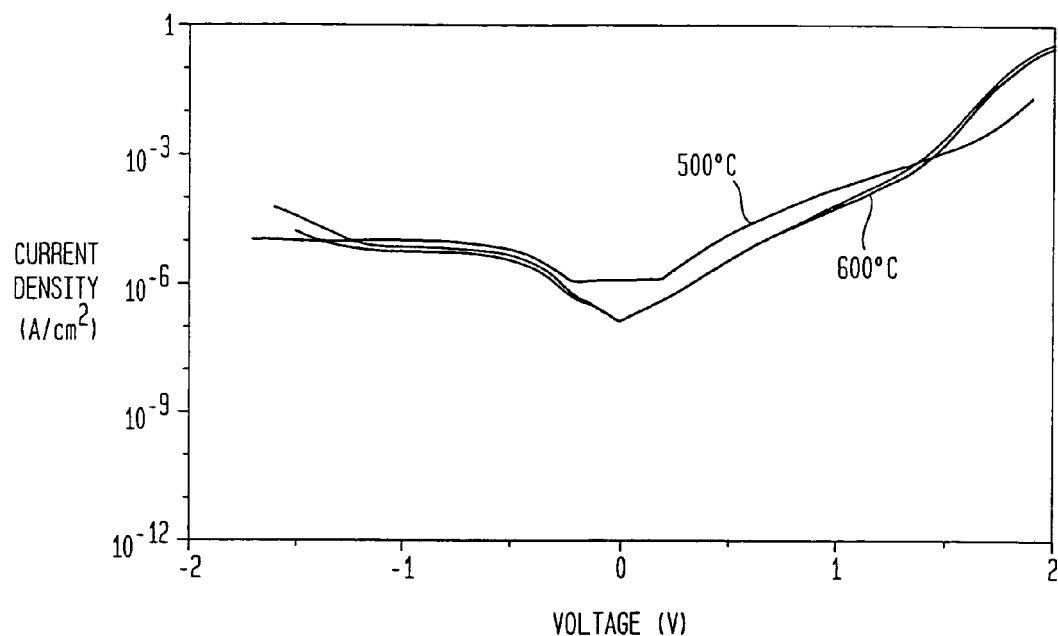
FIG. 8 is a plot showing the IV characteristics of films deposited at 500° and 600° C.

The Al oxide films deposited on Si wafers were characterized electrically by capacitance-voltage (CV), See FIGS. 6 and 7, and current-voltage (IV) measurements, See FIG. 8. Capacitor fabrication suitable for electrical testing is described below.

After Al oxide deposition as described above, capacitors were formed by Al evaporation through a metal mask with the substrates held at room temperature. Prior to depositing the Al contacts the films were annealed in O$_2$ at 600° C. for 30 min and forming gas (FG) at 550° C. for 30 min. The area for these metal contacts was 5.4×10$^{-4}$ cm$^{-3}$. The capacitors were fabricated on n-type Si substrates with P doping at about 1×10$^{15}$ cm$^{-3}$.

Specifically, FIG. 6 shows a family of high frequency (100 KHz) CV curves of Al oxide films with different thickness deposited at 500° C. A detailed description of the CV characteristics of MOS capacitors can be found in S. M. Sze, "Physics of Semiconductor Devices", Chapter 7, second edition, Wiley Interscience, 1981. It is noted that for voltages above 1 V the capacitance saturates at some fixed value. This is defined as accumulation capacitance which is given by $C_o=(K_o KA)/t_{ph}$ where $K_o$ is the permittivity in vacuum, K is the dielectric constant of the insulator, A is the capacitor area and $t_{ph}$ is the insulator physical thickness. Thus, the higher the accumulation capacitance for a given capacitor area, A, the thinner is the oxide film as shown in FIG. 6. If K is normalized to the SiO$_2$ dielectric constant of 3.9, then the physical thickness is expressed as an equivalent thickness. In order to increase circuit performance, low $t^{eq}$ are desirable. Furthermore, when the oxide is very thin, very high electric fields are generated at the interface with the result that the classical formula is not correct and should be corrected for quantum effects. Simulations by Lo, et al., IEEE Elect. Dev. Lett. 18, 209 (1997), relate the accumulation capacitance to the a quantum mechanical physical thickness $t_{qm}$. In the present analysis, $t_{qm}$ rather than $t_{eq}$ is used.

Another important feature of the CV characteristics is "flatband". Flatband voltage is defined as the voltage where the semiconductors energy bands are flat with respect to the applied voltage. For an ideal condition this occurs at V=0. In general, non ideal flat band shifts are observed in metal oxide semiconductor (MOS) capacitors because of non ideal conditions. Excessive charge in the films or at the oxide/Si interface can produce non ideal shifts. Also, different metals deposited on the oxide produce flat band shifts because of their inherent different work function values.

In general, for the low doping substrates used here flat band occurs for capacitance values below 100 pF. Flat band shift measured on the capacitor with low $t_{qm}$ (high accumulation capacitance) is about −0.6/0.7V. By subtracting −0.3 V correction for Al work function flat band condition occurs at a voltage of about −0.3/0.4 V instead of V=0. Thus, some charge at the interface or in the bulk $Al_2O_3$ may exist. Note also that some hystersis is present in the CV characteristics, indicating undesirable film charge trapping.

Dielectric constant values of the Al oxide were measured by using a linear fit of the oxide quantum mechanical thickness extracted from CV characteristics versus the physical oxide thickness determined by n&k analysis (n&k Analyzer, n&k Technology, S. Clara , Calif.). By assuming that the total capacitance is represented by an interfacial $SiO_2$ capacitance in series with a high K dielectric film capacitance and using the parallel plate capacitor equation, the equivalent quantum mechanical $t_{qm}$ (or classical $t_{eq}$) thickness versus the physical thickness $t_{ph}$ can be written as:

$$t_{qm}(t_{eq})=t_{ox}+t_{ph}(K_{ox}/K)$$

where $t_{ox}$ is the interfacial oxide thickness and $K_{ox}$ is the interfacial oxide dielectric constant. In this analysis, $K_{ox}=3.9$ ($SiO_2$ dielectric constant). The quantum mechanical thickness $t_{qm}$ was calculated according to an IBM simulator, based on the "Lo et al." reference, requiring the dot area and accumulation capacitance value at about 2.1 V. From the measured electrical and physical thickness values, the dielectric constant $K_{qm}$ and the residual interfacial layer $R_{qm}$ thickness were than extracted via equation (3), using a least square fitting procedure.

Figure 9:
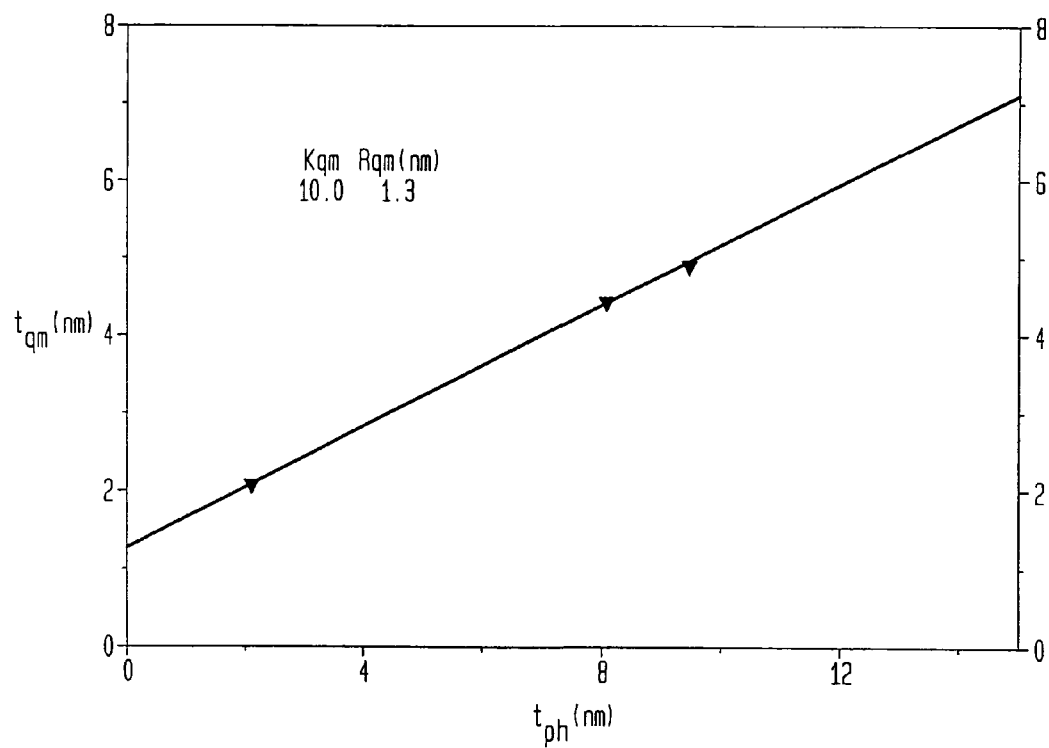
FIG. 9 is a plot of $t_{qm}$ (nm) vs. $t_{ph}$ (nm) showing the dielectric constants of Al oxide films deposited at 500° C. and annealed in $O_2$ and forming gas.

The results for the Al oxide films deposited at 500° C. and annealed in $O_2$ and FG are shown in FIG. 9. Dielectric constant is about 10 and the residual $SiO_2$ layer about 1.3 nm.

FIG. 7 shows a family of CV curves for Al oxide films deposited at 600° C. and annealed in $O_2$ and FG as above. The curve with low $t_{qm}$ (high accumulation capacitance) shows a flatband shift of about −0.65 V which is about −0.35V from ideal when corrected for the Al work function. Note that the hysterisis for the low $t_{qm}$ (~1.8) film is very small <10 mV. FIG. 7 indicates that the residual interfacial layer may also be reduced to a few Angstroms when compared with the 500° C. process. In general, the 600° C. process produced better electrical performance than 500° C. because of the reduced hysterisis and reduced interfacial layer thickness.

Figure 10:
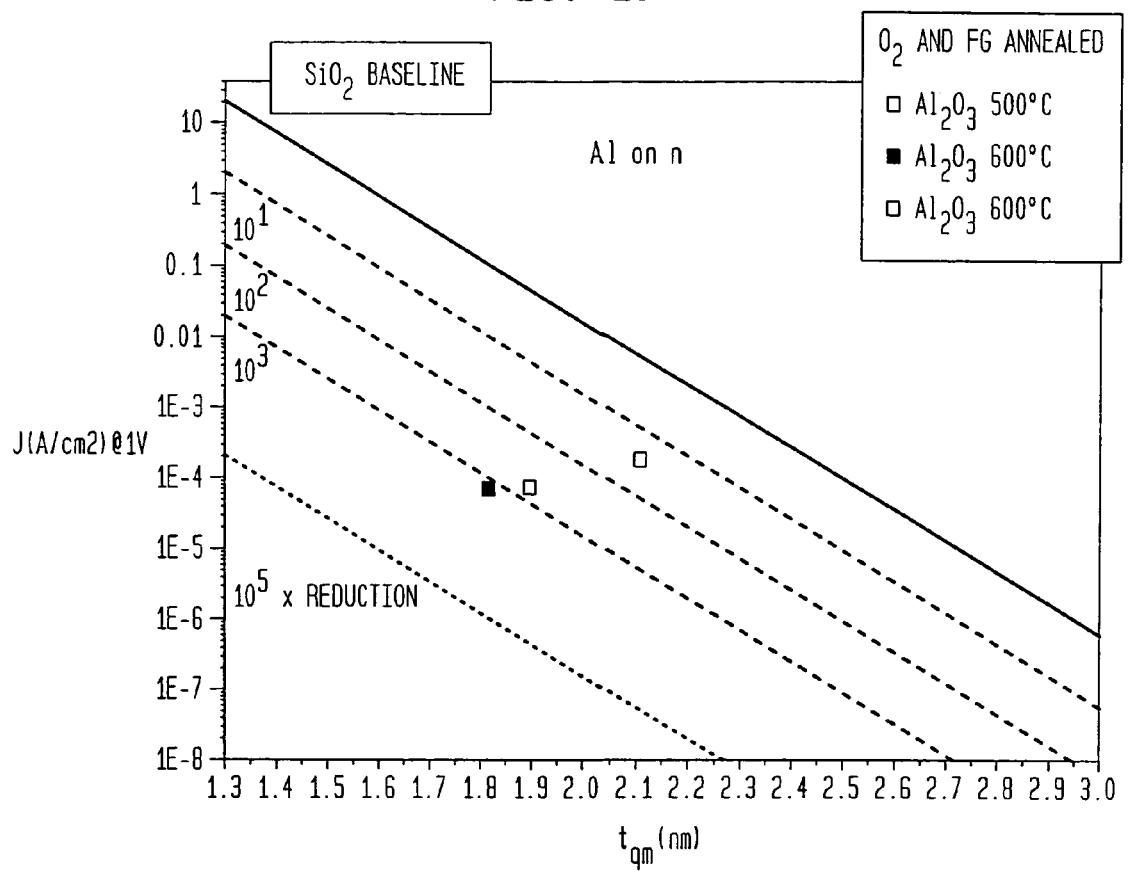
FIG. 10 is a plot of the leakage current for various deposited and annealed aluminum oxide films.

Main motivation behind the use of high-K dielectric material for $SiO_2$ gate replacement is the use of thicker dielectrics which can reach oxide equivalent thickness of 10 Å or below maintaining lower leakage currents than $SiO_2$. FIG. 8 shows IV characteristics of films deposited at 500° C. and 600° C. The current densities at 1 V are plotted again in FIG. 10. As can be seen, for Al oxide films deposited at 600° C. leakage reduction is about 3 orders of magnitude when compared with the equivalent $SiO_2$ oxide thickness. Again the 600° C. deposition process show lower leakage than the 500° C. process where leakage reduction was only 15 times with respect to $SiO_2$.

Based on the above disclosed results, it is desirable in the present invention to set the growth temperature of aluminum oxide to temperatures greater than 500° C.

EXAMPLE 2

Chemical Vapor Deposition of Aluminum Oxide

In this embodiment, the liquid is not vaporized and is diverted from the CVD or ALD reactor. The aluminum alkoxide is dissolved, emulsified or suspended in a liquid which vaporizes at a higher temperature. The aluminum alkoxide and the liquid is introduced into a vaporizer where the aluminum alkoxide is vaporized. The liquid is not vaporized, but instead is diverted from the reactor in liquid form.

Figure 11:
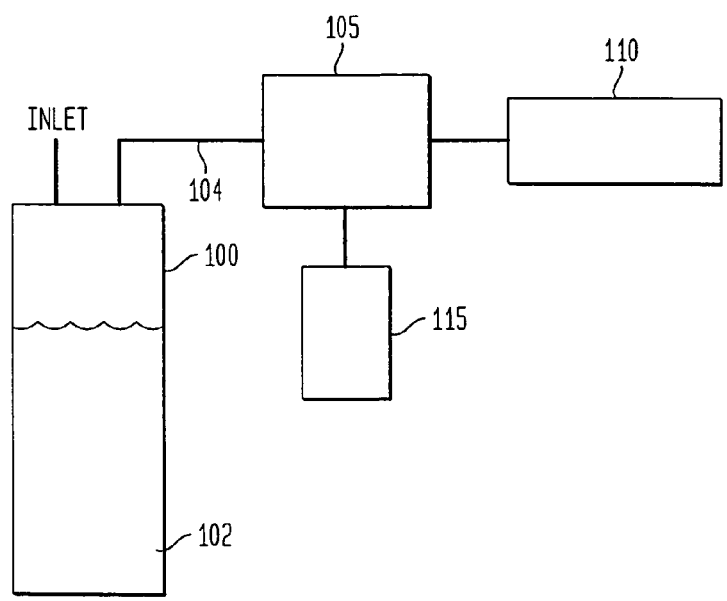
FIG. 11 is a schematic representation of a delivery system for chemical vapor deposition or atomic layer deposition of a film or coating.

One possible apparatus configuration is shown in FIG. 11. As shown in this figure, the aluminum alkoxide and liquid (102) would flow from ampoule 100 to vaporizer 105 through outlet 104. The aluminum alkoxide is volatilized in the vaporizer, but the liquid is not. The vaporized aluminum alkoxide is then transported to reactor 110, and the nonvaporized inert liquid is drained out of the vaporizer and collected in trap 115. The vaporizer temperature is set at less than the boiling point of the liquid.

One preferred method would be aluminum isopropoxide and dodecane (boiling point 216° C.) with the vaporizer temperature set at 120° C., and the deposition temperature greater than 500° C.

EXAMPLE 3

Atomic Layer Deposition of Aluminum Oxide

In this embodiment, a substrate is placed in a suitable reactor for atomic layer deposition, for example the commercial F-200 reactor made by Microchemistry, and an aluminum oxide film is deposited. Atomic layer deposition is performed in a cyclic fashion with sequential alternating pulses of vaporized aluminum alkoxide, reactant and purge gas (and/or vacuum evacuation of reactor chamber before introduction of aluminum alkoxide or reactant).

The aluminum alkoxide source mixture was comprised of 10 grams of aluminum iso-propoxide $Al(i-OC_3H_7)_3$ and 1 liter of octane. In this example, the aluminum alkoxide source is vaporized in a vaporizer and the vapor is introduced into the reactor in a cyclical fashion. In order to deposit aluminum oxide, an oxidant is introduced including, but not limited to: oxygen, ozone, water, hydrogen peroxide, nitrous oxide and combinations° thereof. The preferred oxidant is water.

The vaporizer temperature was 120°–180° C., preferably 120° C. Aluminum oxide was deposited at temperatures greater than 500° C. The aluminum alkoxide, reactant and inert purge gas ($N_2$ or Ar or other inert gas) are pulsed into the reactor in the following sequence:
1. vapor of Al-containing aluminum alkoxide source mixture
2. inert purge
3. reactant
4. inert purge The aluminum alkoxide and reactant pulses (steps 1, and 3) last 0.1–1 second, preferably 0.5 seconds. The inert gas purge pulse (steps 2, and 4) last 0.2–5 seconds, preferably 2 seconds. Completion of steps 1–4 is a cycle, the completion of 1 cycle results in deposition of about 0.4–2 monolayer of aluminum oxide or roughly 0.1 nm. In this example, the preferred thickness of deposited aluminum oxide containing film is 50 nm, so 500 cycles of gas switching as described above are performed.

EXAMPLE 4

Fabrication of a Transistor

In this embodiment, the inventive method is used to deposit aluminum oxide as gate dielectric layer 15 of the PFET and NFET as shown in FIG. 1. A Si wafer substrate containing patterned structures is used. Selected regions of the substrate contain shallow trench isolation (STI) oxide located between the sites of transistor, other regions contain the field oxide, and selected regions of bare Si are exposed in the regions where transistor are to be located. The substrate is then placed in a suitable modular cluster tool, the surface of the bare Si is treated to form a $SiO_xN_y$ layer in-situ without breaking vacuum, before a layer of aluminum oxide is deposited to a thickness of 1–100 nm using the CVD process of this invention. The wafer is then transported to a second module of the modular cluster tool where the gate electrode can be deposited on the aluminum oxide in situ without breaking vacuum.

For the deposition of the aluminum oxide using the inventive method, the aluminum alkoxide source mixture was composed of 40 grams of aluminum iso-propoxide in a liter of isopropanol. The aluminum alkoxide mixture was transported to a vaporizer where the mixture was vaporized at 120° C. and the vapor transported into the chemical vapor deposition module of the cluster tool where an oxidant including, but not limited to: oxygen, ozone, $N_2O$, water, or mixtures thereof was present and an aluminum oxide film was deposited at 600° C.

EXAMPLE 5

Fabrication of a Transistor Utilizing Aluminum Oxide Deposited by the Inventive Method as a Component of a Multilayer Gate Dielectric In this embodiment, the inventive method is used to deposit a multilayer gate dielectric, 53 (See FIG. 12H) where at least one of the layers is aluminum oxide doped or undoped. As shown in FIG. 12H, a transistor device is formed on a conductivity region 54 and contains a gate electrode 52 formed on a gate dielectric 53 and a pair of n-type source/drain regions 51 formed on laterally opposite sides of gate electrode 52. The multilayer gate dielectric 53 is comprised of an optional upper layer, 57 which may act as a dopant diffusion barrier and stabilize the structure during deposition of the gate electrode 52. An optional lower layer 55 which may act as an electron barrier layer and as a layer to prevent oxidation of the underlying silicon during processing or both. The middle layer, 56, is a high-K dielectric layer. A suitable lower layer 55 is composed of dielectric materials including, but not limited to: $SiO_2$, $SiO_xN_y$, or $Si_3N_4$, prepared from oxidation or nitridation of the silicon substrate or deposited separately. Other suitable lower layer materials include metal oxides or metal silicates. The high-K dielectric layer 56 is selected from the group consisting of aluminum oxide or a multilayer structure where at least one of the layers is aluminum oxide. The dielectric materials comprising the multilayer structure with aluminum oxide are selected from the group including, but not limited to: $Ta_2O_5$, $TiO_2$, $ZrO_2$, $HfO_2$, BaO, SrO, CaO, $La_2O_3$, $Y_2O_3$, yttrium alumnate, lathnaum alumnate, lanthanum silicate, yttrium silicate, hafnium silicate, zirconium silicate, doped or undoped mixtures, layers or combinations thereof. The multilayer structure with aluminum oxide may be comprised of several layers of different materials such as a layer of hafnium oxide sandwiched between layers of aluminum oxide. The optional upper layer 57 may be an oxidized or nitrided surface of the middle layer, 56, or a deposited dielectric material including, but not limited to: $SiO_2$, $SiO_xN_y$, $Si_3N_4$, $ZrO_2$, $HfO_2$, aluminum oxide, aluminosilicate, ytrrium silicate, zirconium silicate, hafnium silicate, lanthanum silicate doped or undoped mixtures, layers or combinations thereof. Preferred gate dielectrics are comprised of a lower layer of $SiO_xN_y$, a layer of aluminum oxide, and an upper barrier layer of nitrided aluminum oxide. The aluminum oxide in the gate dielectric 53 is deposited by the inventive method.

FIGS. 12A–12H are cross sectional views showing one preferred means for fabrication of a transistor shown in FIG. 12H using the inventive method. Fabrication of the gate dielectric 53 is done in-situ in a cluster tool as manufactured by Applied Materials. In FIG. 12A, a silicon substrate 50 with a clean (no native $SiO_2$) surface is the starting point. In FIG. 12B, the lower layer 55 has been formed by oxidation/nitridation of the silicon substrate 50 to form a $SiO_xN_y$ layer. In FIG. 12C, a layer 56 of aluminum oxide has been formed by the inventive method, comprised of depositing aluminum oxide by chemical vapor deposition at temperatures greater than 500° C. in the presence of an oxidant such as oxygen, ozone, $N_2O$, $H_2O$ or mixtures thereof. In FIG. 12D, the upper layer 57 is formed by plasma nitridation of the aluminum oxide surface. In FIG. 12E, polysilicon is deposited as the gate electrode 52. In FIGS. 12F–12H, the gates are formed, extension implant done, spacers 58 formed, and source/drain implants performed to produce a fully formed devices. The subsequent steps of contact formation, etc., are not shown.

EXAMPLE 6

Fabrication of a Transistor with Metal Gates Utilizing Aluminum Oxide Deposited by the Inventive Method In this embodiment, the inventive method is used to fabricate a transistor using metal gates. As shown in FIG. 1, a CMOS integrated circuit containing both n-type field effect transistors (NFETs) and p-type field effect transistors (PFETs) is formed on a single substrate 10. NFET device 11 is formed on a p-type conductivity region 13 of substrate 10 and contains a gate electrode 14 formed on a gate dielectric 15 and a pair of n-type source/drain regions 16 formed on laterally opposite sides of gate electrode 14. Similarly, PFET device 17 is formed on a n-type conductivity region 18 of substrate 10 and contains the gate electrode 19 formed on gate dielectric 15 and a pair of p-type conductivity source/drain regions 20 formed along opposite sidewalls of gate electrode 19. The NFET and PFET devices are separated by shallow trench isolation 21 and by spacers 22. In this embodiment, the gate electrode 14 or 19 is comprised of a bulk metal or alloy having the appropriate work function. Metals suitable for the gate electrode 14 of the NFET device 11 include, but are not limited to: Al, Ag, Bi, Cd, Fe, Ga, Hf, In, Mn, Nb, Y, and Zr or alloys thereof. At least one metal suitable for the NFET may also be alloyed with W, Mo, Cr, and Cu to form the gate electrode 14. Metals suitable for the gate electrode 19 of the PFET device 17 include, but are not limited to: Ni, Pt, Be, Ir, Te, Re and Rh. At least one metal suitable for the PFET may also be alloyed with W, Mo, Cr, and Cu to form gate electrode 19. The subsequent steps of contact formation, etc., are not described. In this embodiment, the gate dielectric 15, which is selected from the group consisting of aluminum oxide or a multilayer structure wherein at least one of the layers is aluminum oxide, is deposited by the inventive method.

EXAMPLE 7

Figure 22:
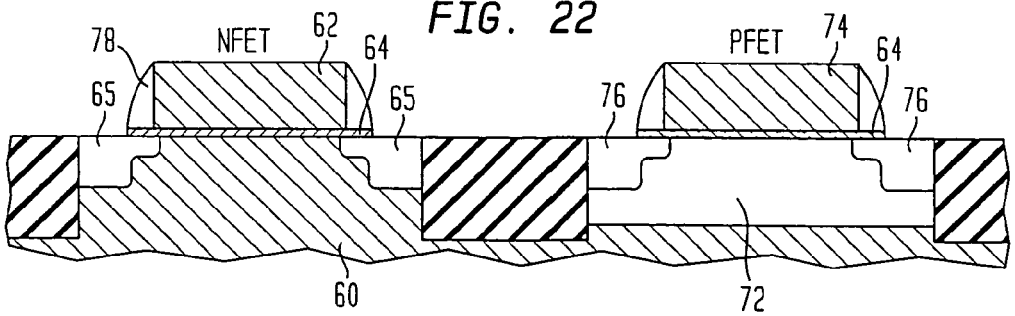

Process Flow for Fabrication of a Transistor Utilizing Aluminum Oxide Deposited by the Inventive Method In this embodiment, the process flow used to fabricate a transistor using metal gates is described. FIG. 22 shows a generic device structure including NFETs and PFETs. In this embodiment NFET and PFET are formed on a single p-type conductive substrate 60. NFET device is formed on a p-type conductivity region of substrate 60 and contains a gate electrode 62 formed on a gate dielectric 64 and a pair of n-type source/drain regions 65 formed on laterally opposite sides of gate electrode 62. Similarly, PFET device is formed on a n-type well 72 of substrate 60 isolated by shallow trench isolation 73 and contains the gate electrode 74 formed on gate dielectric 64 and a pair of p-type conductivity source/drain regions 76 formed along opposite sidewalls of gate electrode 74.

Figure 13:
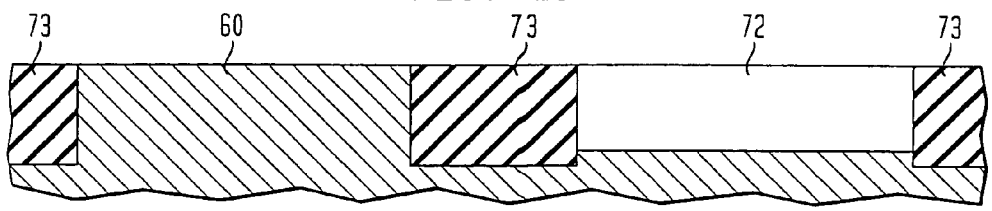
FIGS. 13–22 are illustrations of a cross-sectional view of the fabrication of a transistor.
Figure 14:
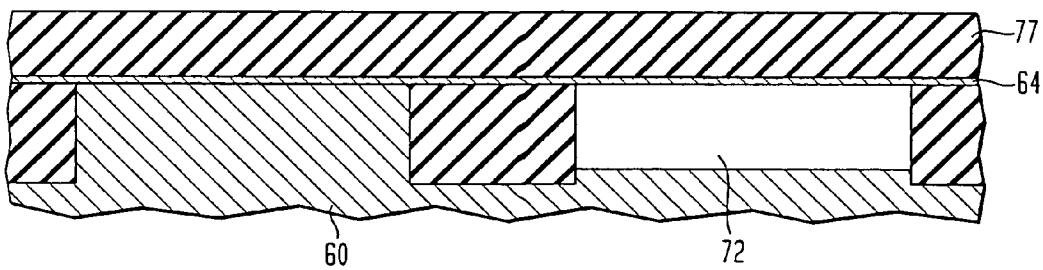
Figure 15:
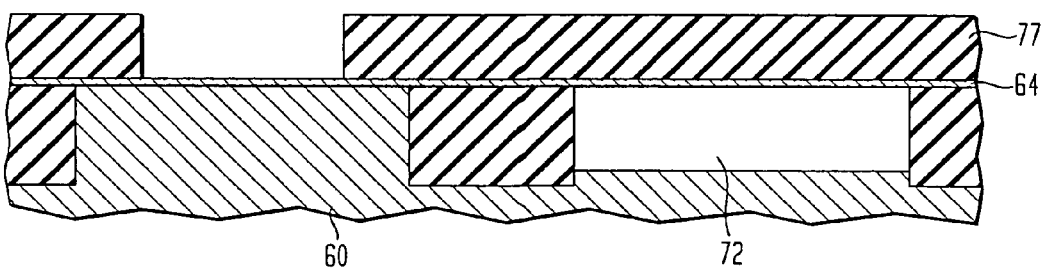
Figure 16:
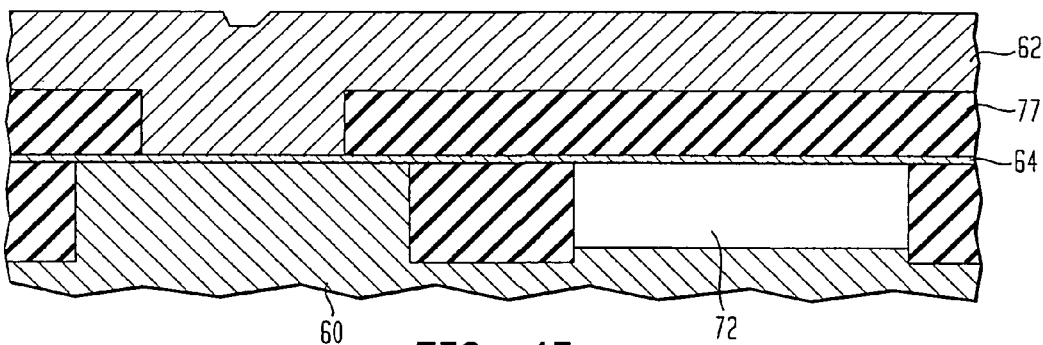
Figure 17:
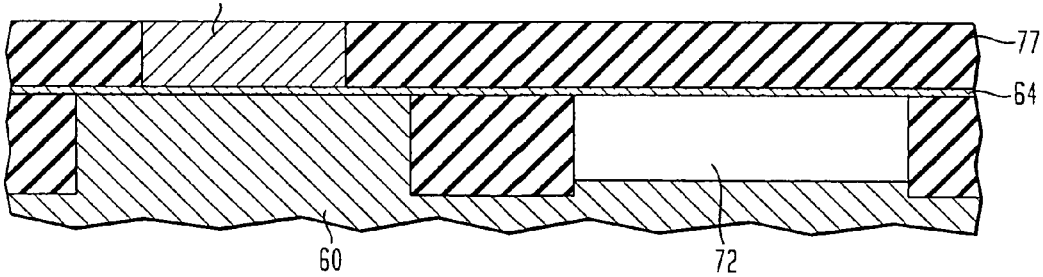
Figure 18:
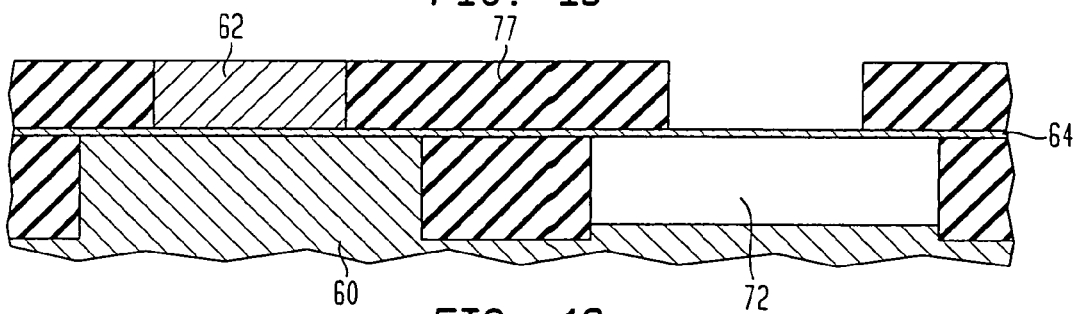
Figure 19:
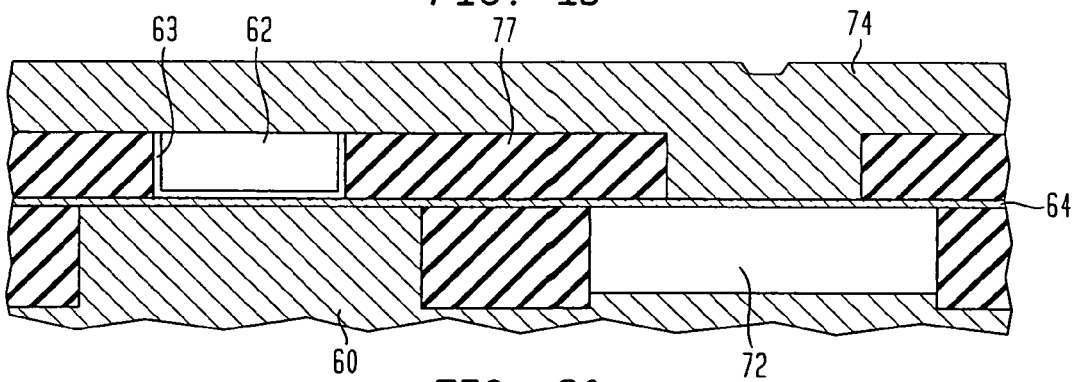
Figure 20:
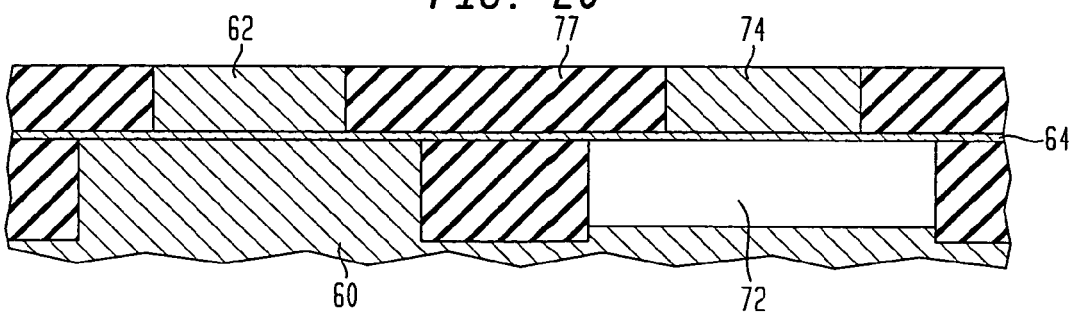
Figure 21:
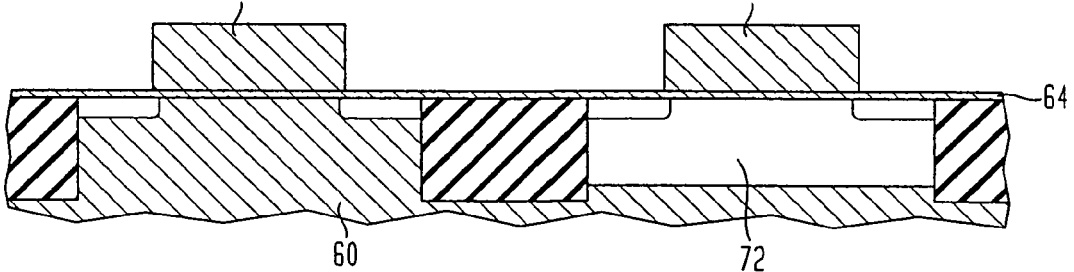

FIGS. 13 through 22 are partial cross sectional views showing one example of a possible fabrication sequence for a standard CMOS flow. In FIG. 13, a silicon substrate 60 having shallow trench isolation (STI) 73 and an N-well 72 are formed in a portion of a p-type conductive substrate. In FIG. 14, a gate dielectric 64 and a masking layer (for example $Si_3N_4$) 77 have been formed on the substrate. The gate dielectric 64 may be deposited according to the inventive method. In FIG. 15, an opening in the masking layer 77 where the NFET gate will go has been formed. In FIG. 16, the NFET gate electrode 62 has been formed. Materials suitable for the NFET gate electrode 62 include, but not limited to: polysilicon, W, Mo, Ti, Cr, Cu, Fe, Mn, Nb, V, Re, Pt, Ag, Bi, Cd, Fe, Ga, Hf, In, Mn, Y, Zr doped or undoped alloys, mixtures and multilayers thereof. The NFET gate electrode 62 may be deposited by the inventive method. In FIG. 17, a chemical-mechanical polish (CMP) step has be done to planarize the surface. In FIGS. 18 through 20, steps are shown which repeat those in FIGS. 15–17 for the PFET device fabrication. In FIG. 18, an opening in the masking layer 77 where the PFET gate will go has been formed. In FIG. 19, the PFET gate electrode 74 has been formed. Materials suitable for the gate electrode 74 for PFET include, but not limited to: polysilicon, Ni, W, Mo, Ti, Cr, Te, Cu, Pd, Pt, Be, Au, Ir, Te, Rh, doped or undoped alloys, mixtures and multilayers thereof. The PFET gate electrode 74 may be deposited by the inventive method. In FIG. 20, a chemical-mechanical polish (CMP) step has be done to planarize the surface. In FIG. 21, extension implants are performed, one for the NFET, and one for the PFET, each through a blocking layer. In FIG. 22, source/drain implants are performed, after a spacer 78 formation process, one for the NFET, and one for the PFET, each through a blocking layer to complete device fabrication. The subsequent steps of contact formation, etc. are not shown. In this embodiment, the gate dielectric 64, which is selected from the group consisting of aluminum oxide or a multilayer structure where at least one of the layers is aluminum oxide, is deposited by the inventive method.

EXAMPLE 8

Fabrication of a Stack Capacitor

In this embodiment, an integrated circuit capacitor is fabricated incorporating aluminum oxide deposited by the inventive method. As shown in FIG. 2, a typical capacitor is formed on a substrate 30, connected by a plug 31 to a transistor, with a barrier 32 and consists of a bottom electrode 33, a dielectric material 34 which may or may not be ferroelectric, and a top electrode 35. In this embodiment, the dielectric material, 34 aluminum oxide, is deposited by the inventive method.

Figure 23:
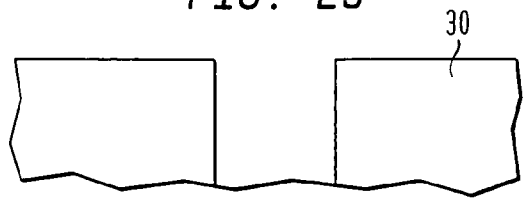
FIGS. 23–27 are illustrations of a cross-sectional view of the fabrication of a stack capacitor.
Figure 24:
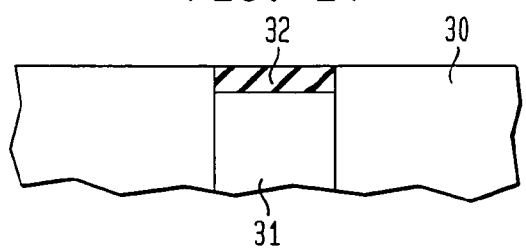
Figure 25:
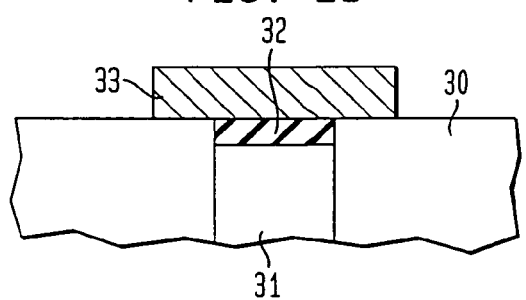
Figure 26:
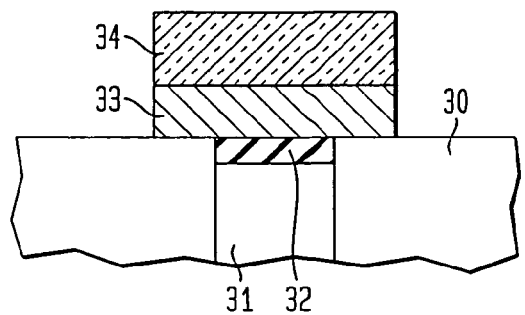
Figure 27:
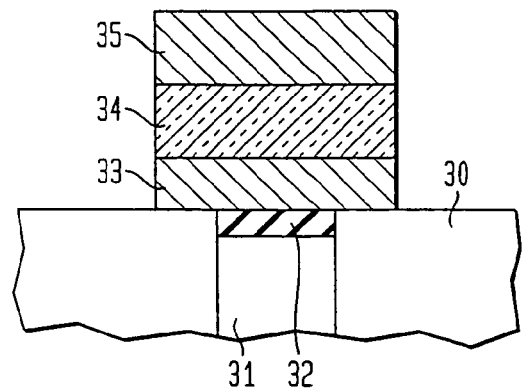

FIGS. 23 through 27 are partial cross sectional views showing one example of a possible fabrication sequence for a capacitor. In FIG. 23, a substrate 30 having a trench is formed. Substrates include, but are not limited to: Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof. In FIG. 24, a plug material 31 and an optional barrier 32 is formed. The plug material is composed of conventional conductive materials including, but not limited to: polysilicon, W, Mo, Ti, Cr, Cu, and may deposited utilizing the inventive method. The optional conductive barrier 32 is composed of conventional conductive materials including, but not limited to: TaN, TaSiN, TiAlN, TiSiN, TaSiN, TaWN, TiWN, TaSiN, TaAlN, NbN, ZrN, TaTiN, TiSiN, TiAlN, $IrO_2$, SiC, TiPt, TiNPt, TiAlN—Pt, Ru, $RuO_2$, RuPt, $RuO_2$, WSi, Ti, TiSi, doped and undoped polysilicon, Al, Pd, Ir, $IrO_x$, Os, $OsO_x$, MoSi, TiSi, $ReO_2$, mixtures or multilayers thereof and may be deposited utilizing the inventive method. In FIG. 25, a bottom electrode 33 is formed. The bottom electrode is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayer thereof. In FIG. 26, a dielectric material 34 is formed. The dielectric material is selected from the group consisting of aluminum oxide or a multilayer structure where at least one of the layers is aluminum oxide. The dielectric materials comprising the multilayer structure with aluminum oxide are selected from any insulating material including, but not limited to: $SiO_2$, $SiO_xN_y$, $Si_3N_4$, metal oxides such as $Ta_2O_5$, $TiO_2$, BaO, SrO, CaO, $ZrO_2$, $HfO_2$, $La_2O_3$, $Y_2O_3$ alloys, mixtures or layers thereof, or multicomponent metal oxides such as pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include, but are not limited to: barium strontium titanate, zirconate, or hafnate, lead titanate, yttrium alumnate, lanthanum alumnate, lead zirconium titanate, silicates such as hafnium silicate, zirconium silicate including rare earth doped silicates. In FIG. 27, a top electrode 35 is formed. The top electrode is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayer, thereof. The top and bottom electrode may or may not be similar. In this embodiment, the dielectric material 34, which is selected from group consisting of aluminum oxide or multilayer structure wherein at least one of the layers is aluminum oxide, is deposited by the inventive method.

EXAMPLE 9

Fabrication of a Trench Capacitor

Figure 28:
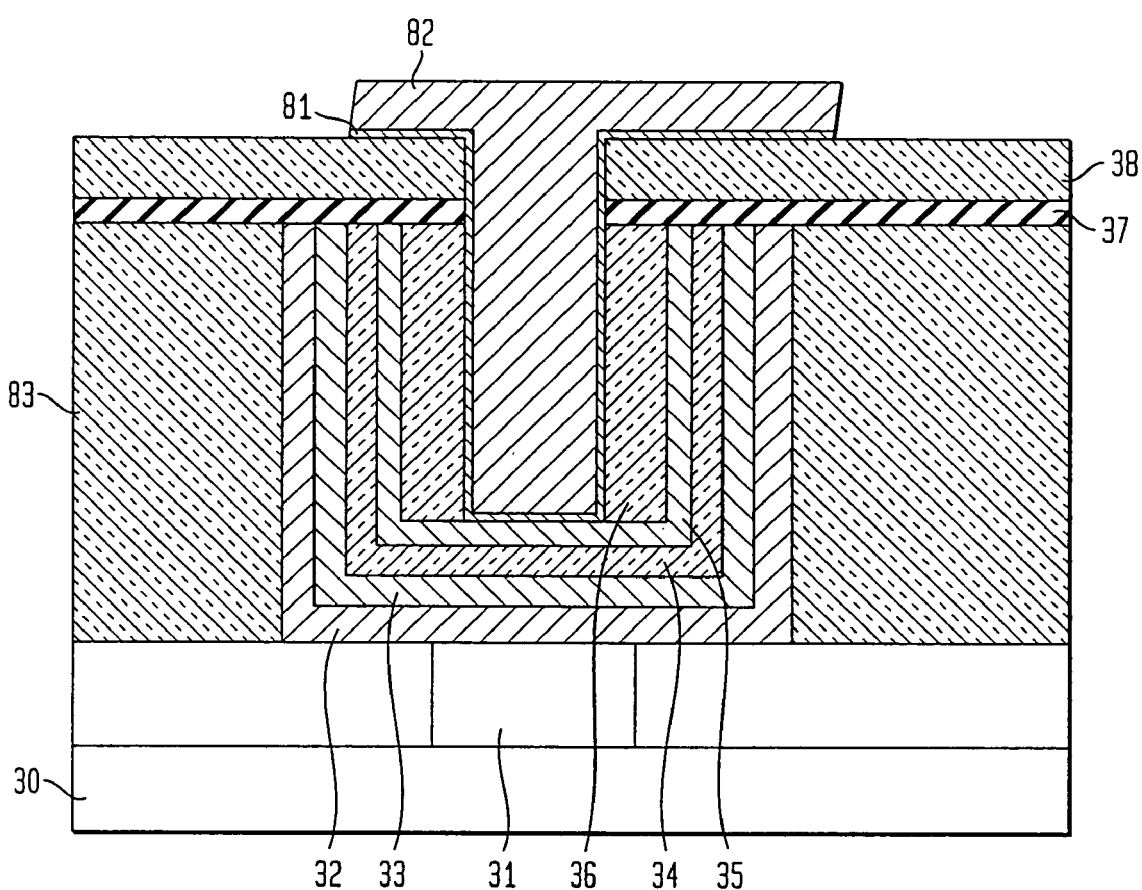
FIG. 28 is an illustration of a cross-sectional view of a trench capacitor.

In this embodiment, an integrated circuit trench capacitor is fabricated incorporating at least one component deposited by the inventive method. One possible example for fabricating a trench capacitor on a substrate 30 is shown in FIG. 28. A capacitor recess is formed in the substrate 30 which is connected to underlying circuitry via plug 31. The circuitry is covered with a dielectric insulating layer (isolation dielectric) 83. Substrates include, but are not limited to: Si-containing semiconductor substrates, silicon on insulator substrates, Ge substrates, SiGe substrates, GaAs substrates, and other like substrates, dielectrics, metals, organic substrates, glasses, metal oxides, plastic polymeric substrates and mixtures, combinations and layers thereof. The dielectric insulating layer (isolation dielectric) 83 is selected from any insulating material including, but not limited to: $SiO_2$, $SiO_xN_y$, $Si_3N_4$, phosphosilicate glass, or metal oxides such as aluminum oxide doped or undoped mixtures, or multilayers thereof. Over the plug and the capacitor recess is deposited in sequence, an optional conductive barrier layer 32, bottom electrode layer 33, dielectric layer 34, and a top electrode layer 35, and optional dielectric buffer layer 36. The plug material is composed of conventional conductive materials including, but not limited to: polysilicon, W, Mo, Ti, Cr, Cu, and may be deposited utilizing the inventive method. The optional conductive barrier 32 is composed of conventional conductive materials including, but not limited to: TaN, TaSiN, TiAlN, TiSiN, TaSiN, TaWN, TiWN, TaSiN, TaAlN, NbN, ZrN, TaTiN, TiSiN, TiAlN, $IrO_2$, SiC, TiPt, TiNPt, TiAlN—Pt, Ru, $RuO_2$, RuPt, $RuO_2$, WSi, Ti, TiSi, doped and undoped polysilicon, Al, Pd, Ir, $IrO_x$, Os, $OsO_x$, MoSi, TiSi, $ReO_2$, mixtures or multilayers thereof and may be deposited utilizing the inventive method. The bottom electrode 33 is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayers thereof. The dielectric material, 34, is selected from the group consisting of aluminum oxide or a multilayer structure where at least one of the layers is aluminum oxide. The dielectric materials comprising the multilayer structure with aluminum oxide are selected from any insulating material including, but not limited to: $SiO_2$, $SiO_xN_y$, $Si_3N_4$, metal oxides such as $Ta_2O_5$, $TiO_2$, BaO, SrO, CaO, $ZrO_2$, $HfO_2$, aluminum oxide, $La_2O_3$, $Y_2O_3$ alloys, mixtures or layers thereof, or multicomponent metal oxides such as pervoskite type oxide having the formula $ABO_3$ wherein B is at least one acid oxide containing a metal selected from the group consisting of Al, Ti, Zr, Hf, V, Nb, Ta, Cr, Mo, W and Cu, and A is at least one additional cation having a positive formal charge of from about 1 to about 3. Examples include but are not limited to: barium strontium titanate, zirconate, or hafnate, lead titanate, yttrium alumnate, lanthanum alumnate, lead zirconium titanate, silicates such as hafnium silicate, zirconium silicate including rare earth doped silicates. The top electrode 35 is composed of conductive materials including, but not limited to: polysilicon, Ni, Pd, Pt, Cu, Ag, Au, Ru, Ir, Rh,$IrO_x$, $RuO_x$, TaN, TaSiN, Ta, $SrRuO_3$, $LaSrCoO_3$, doped or undoped alloys, mixtures, or multilayer, thereof. The top and bottom electrode may or may not be similar. The optional dielectric barrier is composed of any insulating material including, but not limited to: $SiO_2$, $SiO_xN_y$, $Si_3N_4$, TiON, AlN, SiN, TiN, metal oxides such as $Ta_2O_5$, $TiO_2$, $ZrO_2$, $HfO_2$, aluminum oxide, $La_2O_3$, $Y_2O_3$, alloys, mixtures or layers thereof, or multicomponent metal oxides. The sequentially deposited layers are planarized to yield a trench capacitor in the capacitor recess. An insulating passivation layer 37 and an inter-layer dielectric layer 38 are deposited to form a barrier structure over the trench capacitor in the capacitor recess. The insulating passivation layer 37 is composed of any insulating material including, but not limited to: $SiO_2$, $SiO_xN_y$, $Si_3N_4$, TiON, AlN, SiN, TiN, metal oxides such as $Ta_2O_5$, $TiO_2$, $ZrO_2$, $HfO_2$, aluminum oxide, $La_2O_3$, $Y_2O_3$, alloys, mixtures or layers thereof, or multicomponent metal oxides. The inter-layer dielectric 38 is selected from any insulating material including, but not limited to: $SiO_2$, $SiO_xN_y$, $Si_3N_4$, phosphosilicate glass, or metal oxides such as aluminum oxide doped or undoped mixtures, or multilayer, thereof. A via is formed in the barrier structure. A diffusion barrier layer 81 and a metallization layer 82 are deposited over the barrier structure and via. The diffusion barrier layer 81 includes, but not limited to: WN, TiN, or TaN. The metallization layer 82 is selected from any conductive material including, but not limited to: Al, W, Mo, Ti, Cr, or Cu doped or undoped alloys, mixtures, or layers thereof. In this embodiment, the dielectric material 34, which is selected from the group consisting of aluminum oxide or a multilayer structure wherein at least one of the layers is aluminum oxide, is deposited by the inventive method; optionally aluminum oxide may be utilized as the dielectric including, but not limited to insulating passivation layer, inter-layer dielectric, diffusion barrier layer, isolation dielectric.

EXAMPLE 10

Fabrication of a Wiring Structure Utilizing Aluminum Oxide

In this embodiment, an integrated circuit wiring structure is fabricated incorporating at least one component deposited by the inventive method. As shown in FIG. 3A, a typical wiring structure is formed by etching trenches 41 and vias 42 into a dielectric layer 43 selected from the group consisting of aluminum oxide or multilayer structures with aluminum oxide. The multilayer structures with aluminum oxide may consist of one or more layers selected from the group consisting of $SiO_2$, $SiO_xN_y$, $Si_3N_4$, phosphosilicate glass, or metal oxides doped or undoped mixtures, or multilayers thereof. The metallization layer may be patterned by a damascene or a dual damascene process or by lithography and etching. Below dielectric layer 43 is a metal thin film wire 44, selected from any conductive material including, but not limited to: Al, W, Mo, Ti, Cr, or Cu alloys, mixtures, or layers thereof, and a dielectric layer 45 selected from the group consisting of aluminum oxide or multilayer structures with aluminum oxide. The multilayer structures with aluminum oxide may consist of one or more layers selected from the group consisting $SiO_2$, $SiO_xN_y$, $Si_3N_4$, phosphosilicate glass, or metal oxides such as aluminum oxide doped or undoped mixtures, or multilayers thereof. In FIG. 3B, the trench and via are filled with a barrier material 46, including, but not limited to: WN, TiN, or TaN and a wiring metal 47 selected from any conductive material including, but not limited to: Al, W, Mo, Ti, Cr, or Cu doped or undoped alloys, mixtures, or layers thereof. In this embodiment, the dielectric layer 43 or 45, contains aluminum oxide deposited by the inventive method.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A multilayer structure comprising γ-aluminum oxide that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

2. A multicomponent film comprising γ-aluminum that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

3. An electronic device that contains γ-aluminum oxide that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

4. The electronic device of claim 3 selected from the group consisting of a transistor, capacitor, diode, resistor, switch, light emitting diode, laser, wiring structure, and interconnect.

5. A capacitor structure comprising a bottom electrode layer, a dielectric layer and a top electrode layer on a base structure wherein the dielectric layer comprises γ-aluminum oxide that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

6. The capacitor structure of claim 5 wherein the capacitor structure is selected from the group consisting of stack capacitors and trench capacitors.

7. The capacitor structure of claim 5 further comprising depositing a dielectric buffer layer over the capacitor structure.

8. The capacitor structure of claim 7 wherein the dielectric buffer layer is selected from the group consisting of γ-aluminum oxide and a multilayer structure with γ-aluminum oxide and any insulating material wherein said γ-aluminum oxide is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

9. The capacitor structure of claim 5 wherein the capacitor structure is connected to underlying circuitry via a plug and an optional conductive barrier.

10. The capacitor structure of claim 9 wherein the plug material is selected from the group consisting of polysilicon, W, Mo, Ti, Cr, Cu, and doped or undoped alloys, mixtures or multilayers thereof.

11. The structure of claim 9 wherein the conductive barrier is selected from the group consisting of TaN, TaSiN, TiAlN, TiSiN, TaSiN, TaWN, TiWN, TaSiN, TaAlN, NbN, ZrN, TaTiN, TiSiN, TiAlN, IrO$_2$, SiC, TiPt, TiNPt, TiAlN—Pt, Ru, RuO$_2$, RuPt, RuO$_2$, WSi, Ti, TiSi, doped and undoped polysilicon, Al, Pd, Ir, IrO$_x$, Os, OsO$_x$, MoSi, TiSi, ReO$_2$, and doped or undoped alloys, mixtures or multilayers thereof.

12. The structure of claim 5 wherein the bottom electrode is selected from the group consisting of conductive materials, polysilicon, Ni, Pd, Pt, Cu, Ag, Au, Ru, Ir, Rh, IrO$_x$, RuO$_x$, TaN, TaSiN, Ta, SrRuO$_3$, LaSrCoO$_3$, and doped or undoped alloys, mixtures or multilayers, thereof.

13. The structure of claim 5 wherein the dielectric material is selected from the group consisting of said γ-aluminum oxide and a multilayer structure of said γ-aluminum oxide and any insulating material.

14. The structure of claim 5 wherein the top electrode is selected from the group consisting of polysilicon, Ni, Pd, Pt, Cu, Ag, Au, Ru, Ir, Rh, IrO$_x$, RuO$_x$, TaN, TaSiN, Ta, SrRuO$_3$, LaSrCoO$_3$, and doped or undoped alloys, mixtures or multilayers thereof.

15. A wiring structure formed by etching trenches and vias into a dielectric layer, patterning the metallization layer, depositing an optional barrier material, and depositing a wiring material, wherein the dielectric layer and/or the optional barrier material comprise aluminum oxide that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

16. The structure of claim 15 wherein the dielectric layer is selected from the group consisting of said γ-aluminum oxide and multilayers of said γ-aluminum oxide and SiO$_2$, SiO$_x$N$_y$, Si$_3$N$_4$, phosphosilicate glass, metal oxides, doped or undoped alloys, mixtures or multilayers, thereof.

17. The structure of claim 15 wherein the optional barrier material is selected from the group consisting of said γ-aluminum oxide and doped or undoped alloys, mixtures or multilayers, thereof of said γ-aluminum oxide and WN, TiN, TaN, SiO$_2$, SiO$_x$N$_y$, Si$_3$N$_4$, phosphosilicate glass, metal oxides.

18. The structure of claim 15 wherein the wiring material is selected from the group consisting of polysilicon, Al, W, Mo, Ti, Cr, Cu and doped or undoped alloys, mixtures or multilayers thereof.

19. A structure comprising a substrate having source and drain regions and a channel region between said source and drain regions; a gate dielectric, aligned to and on top of said channel region; and a gate electrode aligned to and on top of said gate dielectric wherein the gate dielectric comprises aluminum oxide that is characterized by FTIR as having absorption bands at 400 cm$^{-1}$ and 1000 cm$^{-1}$, an absence of an adsorption band due to O—H stretching vibration of OH and H$_2$O at 3700–3000 cm$^{-1}$ and an absence of an absorption band at 581 cm$^{-1}$.

20. The structure of claim 19 wherein the gate dielectric is selected from the group consisting of said aluminum oxide and doped or undoped alloys, mixtures or multilayers of aluminum oxide and SiC$_2$, SiO$_x$N$_y$, Si$_3$N$_4$, BaO, SrO, CaO, Ta$_2$O$_5$, TiC$_2$, ZrO$_2$, HfO$_2$, La$_2$O$_3$, Y$_2$O$_3$, yttrium alumnate, lathnaum alumnate, lanthanum silicate, yttrium silicate, hafnium silicate, zirconium silicate.

21. The structure of claim 19 wherein the gate dielectric is composed of more than one layer and at least one component of at least one of the layers comprising the gate dielectric is said γ-aluminum.

22. The structure of claim 19 wherein the multilayer gate dielectric is composed of a lower, middle and optional upper layer wherein at least one layer or one component of a layer of the gate dielectric is said γ-aluminum oxide.

23. The structure of claim 22 wherein the lower layer is selected from the group consisting of SiO$_2$, SiO$_x$N$_y$, Si$_3$N$_4$, BaO, SrO, CaO, Ta$_2$O$_5$, TiO$_2$, ZrO$_2$, HfO$_2$, Al$_2$O$_3$, La$_2$O$_3$, Y$_2$O$_3$, yttrium alumnate, lathnaum alumnate, lanthanum silicate, yttrium silicate, hafnium silicate, zirconium silicate, and doped or undoped alloys, mixtures or multilayers, thereof.

24. The structure of claim 22 wherein the middle layer is selected from the group consisting of $SiO_2$, $SiO_xN_y$, BaO, SrO, CaO, $Si_3N_4$, $Ta_2O_5$, $TiO_2$, $ZrO_2$, $HfO_2$, $Al_2O_3$, $La_2O_3$, $Y_2O_3$, yttrium alumnate, lathnaum alumnate, lanthanum silicate, yttrium silicate, hafnium silicate, zirconium silicate, and doped or undoped alloys, mixtures or multilayers, thereof.

25. The structure of claim 22 wherein the upper layer is selected from the group consisting of $SiO_2$, $SiO_xN_y$, $Si_3N_4$, BaO, SrO, CaO, $Ta_2O_5$, $TiO_2$, $ZrO_2$, $HfO_2$, $Al_2O_3$, $La_2O_3$, $Y_2O_3$, yttrium alumnate, lathnaum alumnate, lanthanum silicate, yttrium silicate, hafnium silicate, zirconium silicate, and doped or undoped alloys, mixtures or multilayers, thereof.

26. The structure of claim 19 wherein the gate electrode is selected from the group consisting of polysilicon, Al, Ag, Bi, Cd, Fe, Ga, Hf, In, Mn, Nb, Y, Zr, Ni, Pt, Be, Ir, Te, Re, Rh, W, Mo, Cr, Fe, Pd, Au, Rh, Ti, Cr, Cu, and doped or undoped alloys, mixtures or multilayers, thereof.

* * * * *